United States Patent
Li et al.

(10) Patent No.: US 7,606,091 B2
(45) Date of Patent: *Oct. 20, 2009

(54) METHOD FOR NON-VOLATILE MEMORY WITH REDUCED ERASE/WRITE CYCLING DURING TRIMMING OF INITIAL PROGRAMMING VOLTAGE

(75) Inventors: Yan Li, Milpitas, CA (US); Loc Tu, San Jose, CA (US); Charles Moana Hook, Patterson, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/531,217

(22) Filed: Sep. 12, 2006

(65) Prior Publication Data
US 2008/0062768 A1  Mar. 13, 2008

(51) Int. Cl.
G11C 29/00  (2006.01)
G11C 7/00   (2006.01)

(52) U.S. Cl. ............. 365/201; 365/185.03; 365/185.19; 365/185.33; 365/238.5

(58) Field of Classification Search ............ 365/185.03, 365/185.19, 185.33, 201, 238.5
See application file for complete search history.

(56) References Cited

U.S. PATENT DOCUMENTS

| | | | |
|---|---|---|---|
| 4,335,447 A | 6/1982 | Jerrim | |
| 5,070,032 A | 12/1991 | Yuan et al. | |
| 5,095,344 A | 3/1992 | Harari | |
| 5,132,935 A | 7/1992 | Ashmore, Jr. | |
| 5,172,338 A | 12/1992 | Mehrotra et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,444,664 A | 8/1995 | Kuroda et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,774,397 A | 6/1998 | Endoh et al. | |
| 5,801,989 A | 9/1998 | Lee et al. | |
| 5,903,495 A | 5/1999 | Takeuchi et al. | |

(Continued)

FOREIGN PATENT DOCUMENTS

EP  1 227 501 A2  7/2002

(Continued)

OTHER PUBLICATIONS

Eitan et al., "NROM: A Novel Localized Trapping, 2-Bit Nonvolatile Memory Cell," IEEE Electron Device Letters, Vol. 21, No. 11, Nov. 2000, pp. 543-545.

(Continued)

*Primary Examiner*—VanThu Nguyen
(74) *Attorney, Agent, or Firm*—Davis Wright Tremaine LLP

(57) ABSTRACT

High performance non-volatile memory devices have the programming voltages trimmed for individual types of memory pages and word lines. A group of word lines within each erasable block of memory are tested in successive program loops to minimize the problem of incurring excessive number of erase/program cycles. An optimum programming voltage for a given type of memory pages is derived from statistical results of a sample of similar of memory pages.

17 Claims, 18 Drawing Sheets

U.S. PATENT DOCUMENTS

| | | | |
|---|---|---|---|
| 6,011,725 | A | 1/2000 | Eitan |
| 6,046,935 | A | 4/2000 | Takeuchi et al. |
| 6,205,055 | B1 | 3/2001 | Parker |
| 6,219,276 | B1 | 4/2001 | Parker |
| 6,222,762 | B1 | 4/2001 | Guterman et al. |
| 6,246,610 | B1 | 6/2001 | Han et al. |
| 6,246,611 | B1 | 6/2001 | Pawletko et al. |
| 6,269,025 | B1 | 7/2001 | Hollmer et al. |
| 6,304,487 | B1 | 10/2001 | Pawletko et al. |
| 6,738,289 | B2 | 5/2004 | Gongwer et al. |
| 6,788,579 | B2 | 9/2004 | Gregori et al. |
| 6,807,102 | B2 * | 10/2004 | Imamiya et al. ........ 365/185.22 |
| 6,882,567 | B1 | 4/2005 | Wong |
| 6,937,521 | B2 * | 8/2005 | Avni et al. ............. 365/185.22 |
| 6,987,693 | B2 | 1/2006 | Cernea et al. |
| 7,064,986 | B2 * | 6/2006 | Lee et al. ............... 365/185.28 |
| 7,130,210 | B2 * | 10/2006 | Bathul et al. ................. 365/100 |
| 7,180,787 | B2 | 2/2007 | Hosono et al. |
| 7,280,408 | B2 | 10/2007 | Guterman et al. |
| 2006/0104120 | A1 | 5/2006 | Hemink |
| 2008/0062765 | A1 | 3/2008 | Tu et al. |
| 2008/0062770 | A1 | 3/2008 | Tu et al. |
| 2008/0062785 | A1 | 3/2008 | Li et al. |

FOREIGN PATENT DOCUMENTS

| | | |
|---|---|---|
| EP | 1 227 501 A3 | 7/2002 |
| WO | WO 2008/033679 A2 | 3/2008 |
| WO | WO 2008/033693 A2 | 3/2008 |

OTHER PUBLICATIONS

USPTO, "Office Action," mailed in related U.S. Appl. No. 11/531,223 on Apr. 3, 2008, 35 pages.

EPO/ISA, "Notification of Transmittal of the International Search Report and the Written Opinion of the International Searching Authority, or the Declaration," corresponding International Application No. PCT/US2007/077295, mailed on Apr. 21, 2008, 12 pages.

USPTO, "Office Action," mailed in related U.S. Appl. No. 11/531,223 on Oct. 24, 2008, 35 pages.

USPTO, "Notice of Allowance and Fee(s) Due," corresponding U.S. Appl. No. 11/531,223, mailed on Jun. 8, 2009, 9 pages.

* cited by examiner

Tyical Progam/Verify voltages on a Word Line during normal use of the memory

**Programming with Staircase Waveform
Starting at Vi until the Page is verified at Vf**

Multiple Pass Determination of Starting Programming Voltage for a Sample of Pages

METHOD FOR NON-VOLATILE MEMORY WITH REDUCED ERASE/WRITE CYCLING DURING TRIMMING OF INITIAL PROGRAMMING VOLTAGE

CROSS REFERENCE TO RELATED APPLICATIONS

This application is related to the following U.S. patent applications: U.S. application Ser. No. 11/531,223, entitled "Non-Volatile Memory With Reduced Erase/Write Cycling During Trimming Of Initial Programming Voltage," by Yan Li, et al., filed concurrently herewith, on Sep. 12, 2006. U.S. application Ser. No. 11/531,227, entitled "Method For Non-Volatile Memory With Linear Estimation Of Initial Programming Voltage," by Loc Tu, et al., filed concurrently herewith, on Sep. 12, 2006. U.S. application Ser. No. 11/531,230, entitled "Non-Volatile Memory With Linear Estimation Of Initial Programming Voltage," by Loc Tu, et al., filed concurrently herewith, on Sep. 12, 2006.

FIELD OF THE INVENTION

This invention relates generally to non-volatile semiconductor memory such as electrically erasable programmable read-only memory (EEPROM) and flash EEPROM, and specifically to determining optimum initial programming voltages of various groups of memory cells.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

When a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude in order to counteract the accumulating electrons programmed into the charge storage unit of the memory cell. Programming circuits generally apply a series of programming pulses to a selected word line. In this way, a page of memory cells whose control gates are connected to the word line can be programmed together.

To achieve good programming performance, the initial programming voltage $V_{PGM0}$ and the step size must be optimally chosen. If the initial programming voltage $V_{PGM0}$ is chosen too low, it may require an excessive number of programming pulses to reach the target state. On the other hand if $V_{PGM0}$ is chosen too high, especially in a multi-state memory, the programming may overshoot the target state in the first pulse. An optimum initial programming voltage $V_{PGM0}$ would reach the target state in a few steps. The optimum $V_{PGM0}$ is fairly sensitive to manufacturing variations and is traditionally determined by testing at the factory. This is a process known as $V_{PGM0}$ trimming.

Conventionally, before shipping from the factory, a dedicated memory tester is setup to test a number of memory chips in parallel. One of the tests is to determine optimum initial programming voltages ($V_{PGM0}$ trimmings.) Conventional $V_{PGM0}$ trimmings are therefore performed by memory testers that are expensive dedicated machines. Moreover, they tend to test each word line in a piece-meal manner, moving to the next word line after the testing on the current one has been completed. In this manner, a page of memory cells on a word line is programmed in a program loop to test if it is programmable to a target pattern (e.g., "0000 . . . 0" where "0" denote a given programmed state). The program loop typically uses a series of programming voltage pulses from a first starting programming voltage. The page is then read back in a verify operation to determine if it has been properly programmed to a target pattern. If not program-verified, the page/word line of cells is erased and reprogrammed again in the next program loop with an incremented starting programming voltage. This process is repeated until the page is program-verified. In this way, the determination can be made of the value of the starting programming voltage that enables the page to be program-verified.

A number of trials in terms of program loops with increasing initial programming voltages may be needed to obtain the one that enables the page to be programmed properly. It can be seen that in conventional $V_{PGM0}$ trimmings, the page must be erased before the next program loop is performed using an incremented starting voltage. Thus, the word line of memory cells carrying the page could be erased multiple times during these trials. Furthermore, all other word lines in the same erase block are also erase-cycled.

Non-volatile memory device has a limited life usage due to the endurance-related stress suffered each time the device goes through an erase/program cycle. For example, the endurance of a Flash EEPROM device is its ability to withstand a given number of program/erase cycles. The physical phenomenon limiting the endurance of non-volatile memory devices is the trapping of electrons in the active dielectric films of the device. Referring to FIG. 2, during programming, electrons are injected from the substrate to the charge storage unit through a dielectric interface. Similarly, during erasing, electrons are extracted from the charge storage unit through a dielectric interface. In both cases, some of the electrons are trapped by the dielectric interface. The trapped electrons oppose the applied electric field in subsequent program/erase cycles thereby causing the programmed threshold voltage to shift to a lower value and the erased threshold voltage to shift to a higher value. This can be seen in a gradual closure in the threshold window. The threshold window closure is what limits the practical endurance to approximately $10^4$ program/erase cycles.

In a memory architecture where there are many word lines in each block, erasing a word line of cells multiple times would entail erasing the rest of the word lines in the same block the same number of times. If these other word lines in the block are also being tested, the number of times the block is erased would go up geometrically. For example, if it takes roughly 10 trials for each word line, and there are 64 word lines in each block, it will mean the block will suffer erase cycling of a total of 640 times. Furthermore, $V_{PGM0}$ trimming is also performed to cover a number of other variables. For example, the word line may carry multiple physical pages as well as multiple logical pages. The word lines near the block boundary may have slightly different programming characteristics compared to the ones in the core region. These variations could contribute another factor of 10 to the number of trimmings needed. Thus, conventional $V_{PGM}$ trimmings at the factory could consume as much as several thousand endurance cycles of a memory device. As much as half of a memory device's life usage could be used up before it gets to a customer.

Therefore there is a general need for high performance and high capacity non-volatile memory. In particular, there is a need for a non-volatile memory with optimally set starting programming voltages, yet without the expense of excessively endurance cycling the memory to determine them.

SUMMARY OF INVENTION $V_{PGM}$ Trimming With Reduced Erase Cycling

According to one aspect of the invention, in a non-volatile memory having an array of memory cells that are organized into blocks, each block being a block of word lines for accessing memory cells that are erasable together, and each word line containing at least one page of memory cells that are programmable together, an optimum starting voltage for programming a page of memory cells on a word line in a block is estimated by test programming a sample of similar word lines in the block to obtain a statistical average of individual starting voltages that enable each associated page/word line to be programmable to a designated pattern. This is accomplished by a subjecting all the pages of the sample to a program loop where a series of pulses from a starting programming voltage is applied. After each pages of the sample has been through the program loop, the page/word line that has been program-verified is removed from further processing and its associated starting programming voltage is saved. The block is then erased so that the not yet verified word lines in the sample can be reprogrammed subject to the next program loop the next incremented starting voltage. The cycling continues until all word lines in the sample have been program-verified. A statistical average can then be obtained from the individual starting programming voltages to derive an optimum starting programming voltage for the page.

Testing the sample of word lines in a block by the scheme described has the advantage of reducing the number of block erasures. The sample of word line are tested in phase with each other, so that when all the word lines are done programming in each program loop, they are then erased together to be ready for the next program loop. This scheme results in reducing the number of block erasure and can result in a saving of one order of magnitude compared to a conventional scheme. For example, the convention scheme has each word line tested independently with block erasure before every program loop without synchronization with each other. The block erasure associated with every program loop for one word line is then compound for every word line in the sample.

Additional features and advantages of the present invention will be understood from the following description of its preferred embodiments, which description should be taken in conjunction with the accompanying drawings.

DETAILED DESCRIPTION OF THE PREFERRED EMBODIMENTS

Memory System

FIG. 1 to FIG. 7 illustrate example memory systems in which the various aspects of the present invention may be implemented.

Figure 1:
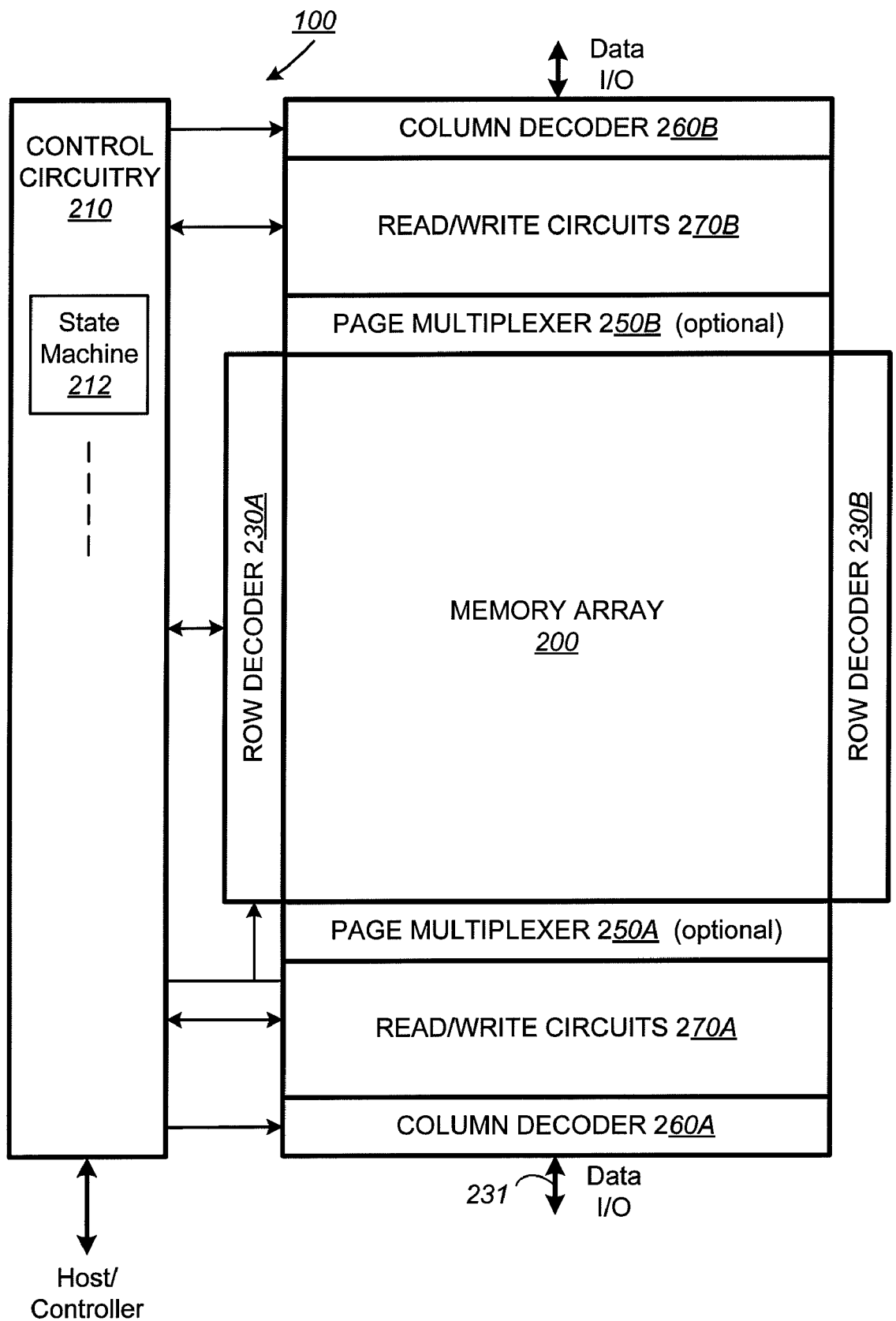
FIG. 1 illustrates schematically the functional blocks of a non-volatile memory chip.

FIG. 1 illustrates schematically the functional blocks of a non-volatile memory chip. The memory chip 100 includes a two-dimensional array of memory cells 200, control circuitry 210, and peripheral circuits such as decoders, read/write circuits and multiplexers. The memory array 200 is addressable by word lines (see FIG. 2) via row decoders 230A and 230B and by bit lines (see FIG. 2) via column decoders 260A and 260B. The read/write circuits 270A and 270B allow a page of memory cells to be read or programmed in parallel. In a preferred embodiment, a page is constituted from a contiguous row of memory cells sharing the same word line. In another embodiment, where a row of memory cells are partitioned into multiple pages, block multiplexers 250A and 250B are provided to multiplex the read/write circuits 270A and 270B to the individual pages.

The control circuitry 210 cooperates with the read/write circuits 270 to perform memory operations on the memory array 200. The control circuitry 210 typically includes a state machine 212 and other circuits such as an on-chip address decoder and a power control module (not shown explicitly). The state machine 212 provides chip level control of memory operations.

The memory array 200 is typically organized as a two-dimensional array of memory cells arranged in rows and columns and addressable by word lines and bit lines. The array can be formed according to an NOR type or an NAND type architecture.

Figure 2:
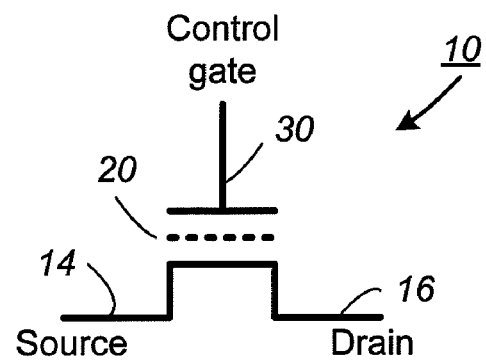
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
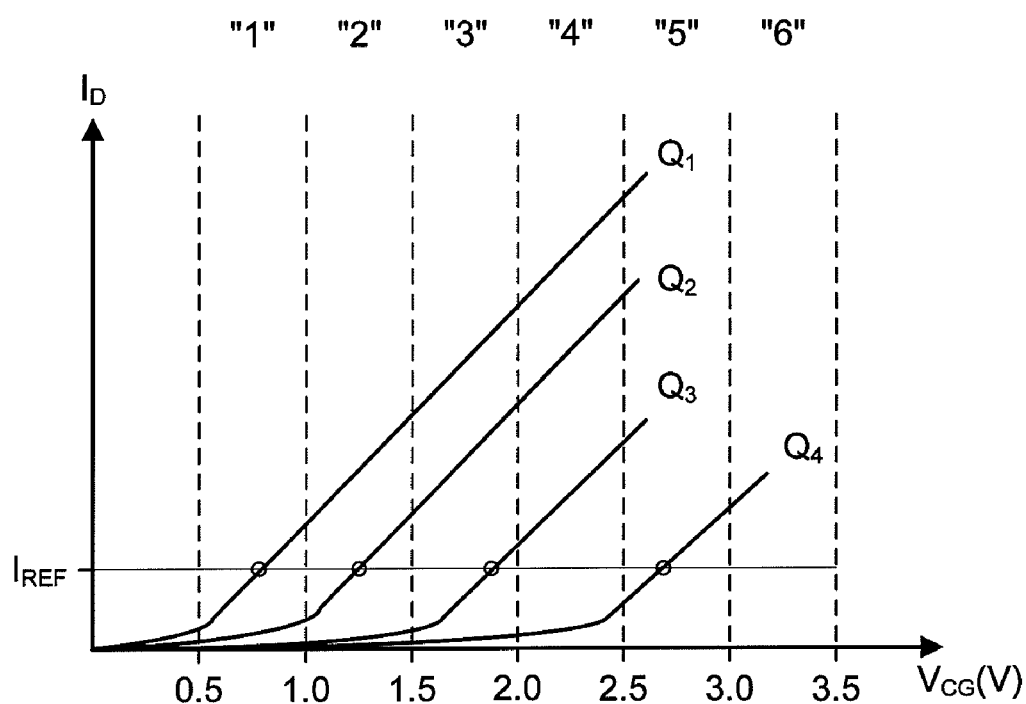
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$, and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

Figure 4:
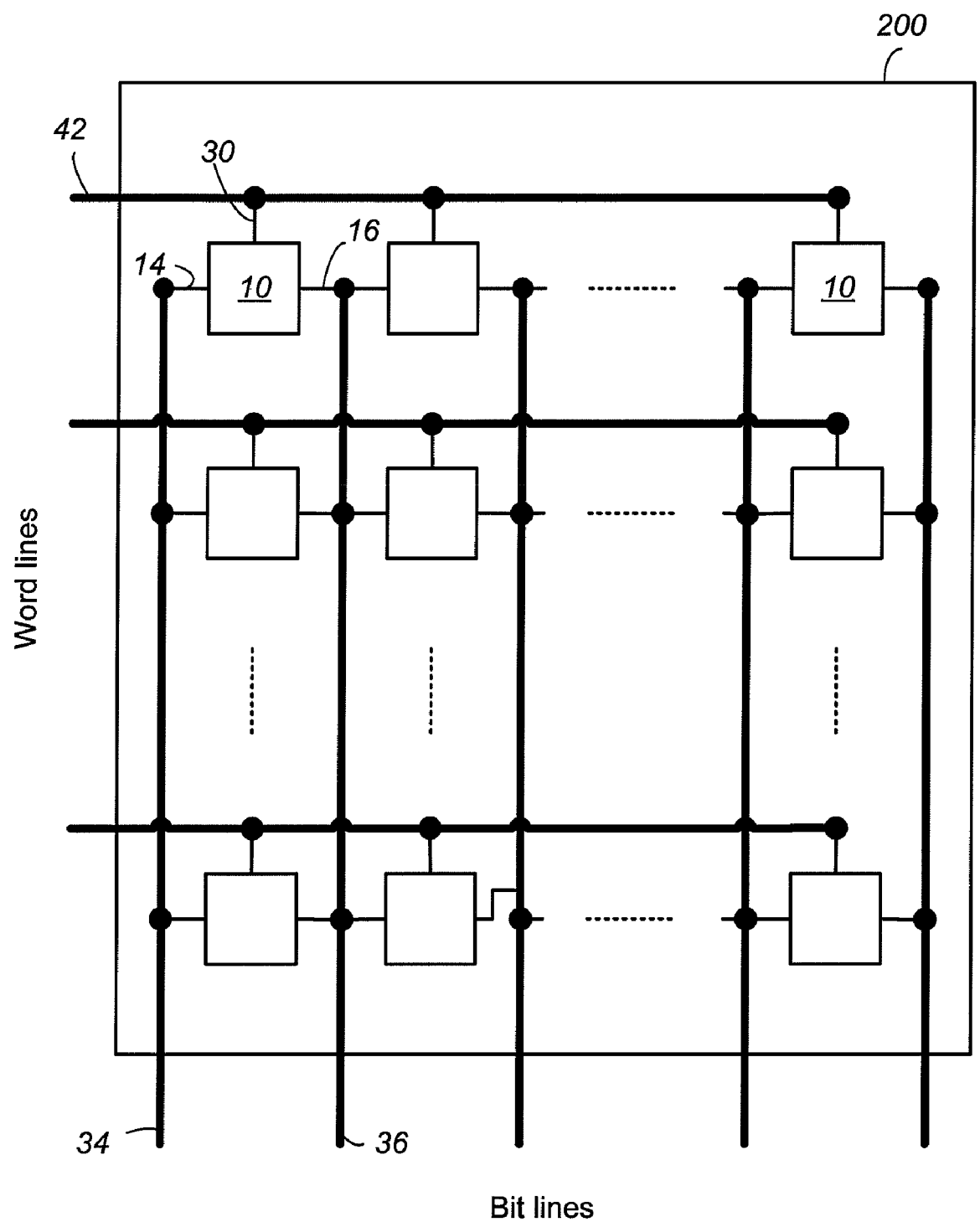
FIG. 4 illustrates an example of an NOR array of memory cells.

FIG. 4 illustrates an example of an NOR array of memory cells. In the memory array 300, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
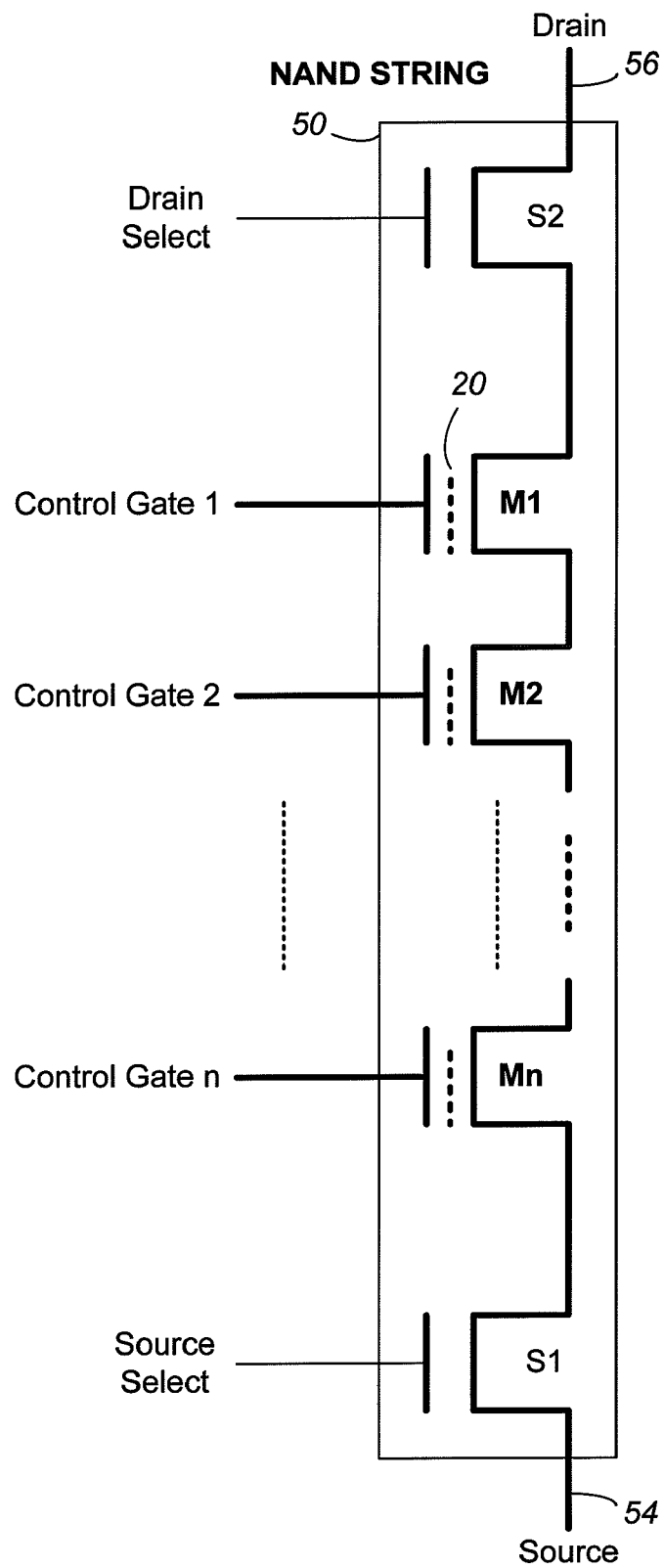
FIG. 5A illustrates schematically a string of memory cells organized into an NAND string.

FIG. 5A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor in the chain has a charge storage element 20 to store a given amount of charge so as to represent an intended memory state. A control gate of each memory transistor provides control over read and write operations. As will be seen in FIG. 5B, the control gates of corresponding memory transistors of a row of NAND string are all connected to the same word line. Similarly, a control gate of each of the select transistors S1, S2 provides control access to the NAND string via its source terminal 54 and drain terminal 56 respectively. Likewise, the control gates of corresponding select. transistors of a row of NAND string are all connected to the same select line.

When an addressed memory transistor within an NAND string is read or is verified during programming, its control gate is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
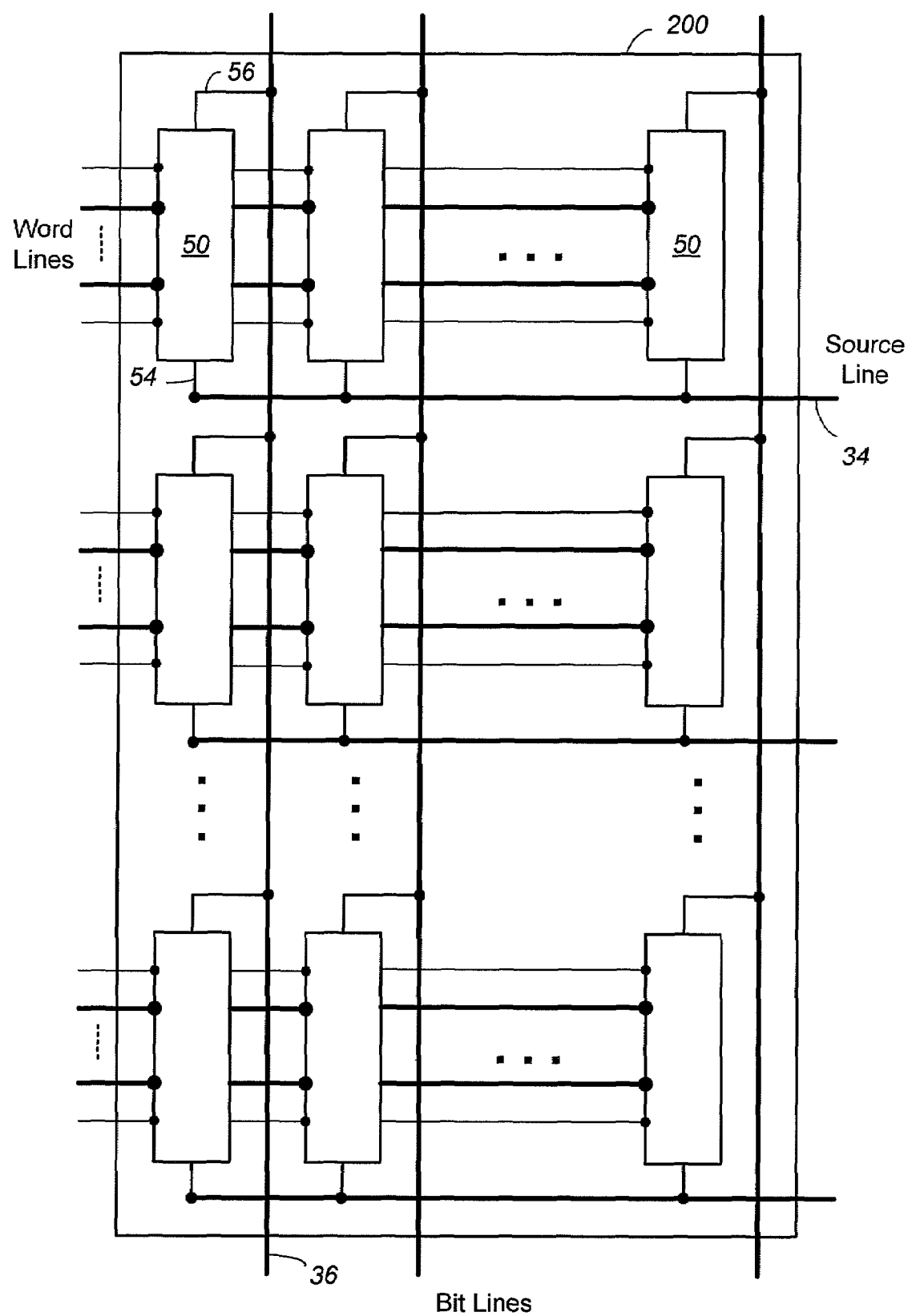
FIG. 5B illustrates an example of an NAND array of memory cells, constituted from NAND strings such as that shown in FIG. 5A.

FIG. 5B illustrates an example of an NAND array of memory cells, constituted from NAND strings such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also control gates along a row of cells in a bank of NAND strings are connected to a word line. An entire row of memory cells in a bank of NAND strings can be addressed by appropriate voltages on the word lines and select lines of the bank of NAND string. When a memory transistor within a NAND string is being read, the remaining memory transistors in the string are turned on hard via their associated word lines so that the current flowing through the string is essentially dependent upon the level of charge stored in the cell being read.

Figure 6:
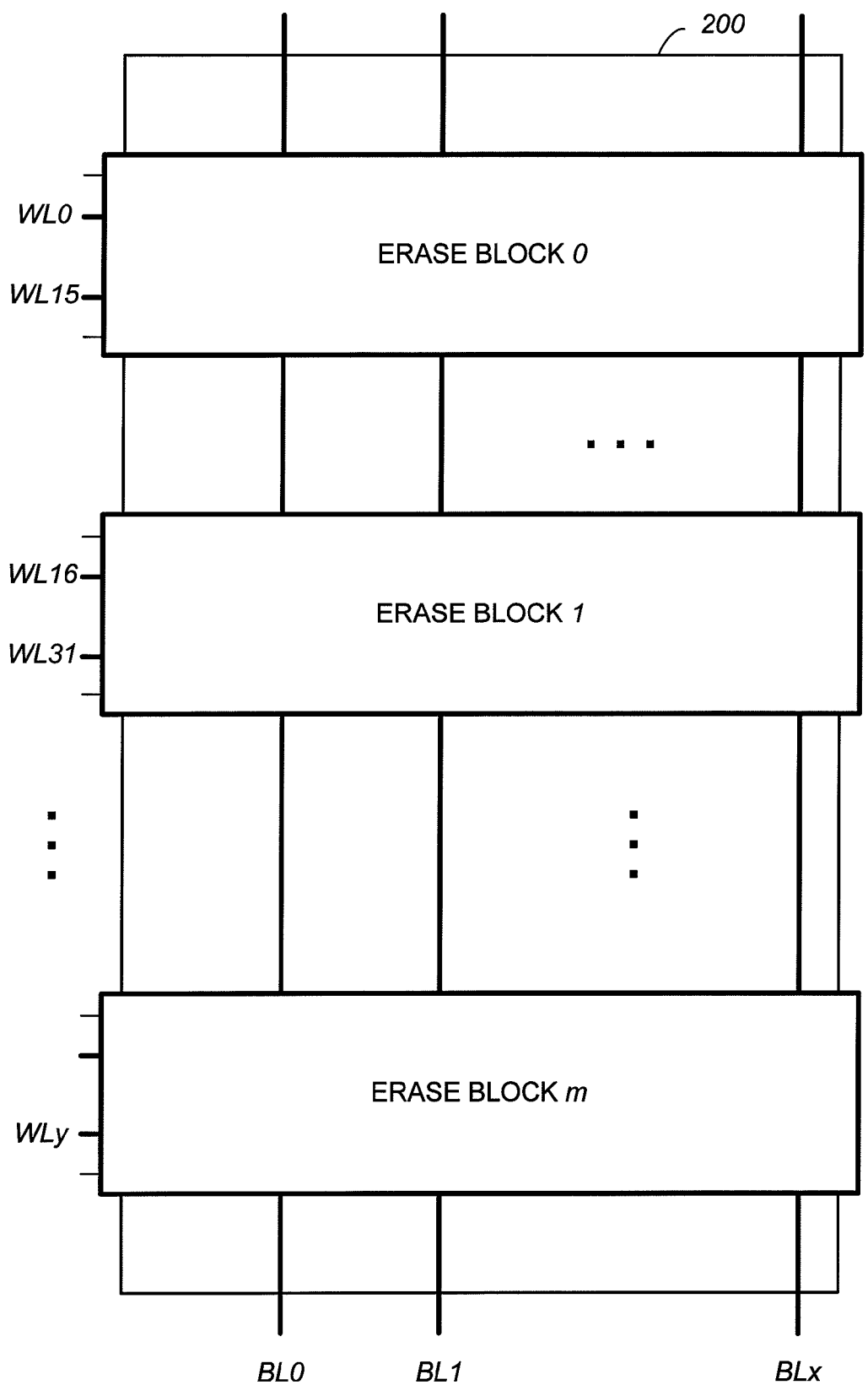
FIG. 6 illustrates schematically, an example of a memory array organized in erasable blocks.

FIG. 6 illustrates schematically, an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 6, individual memory cells in the memory array 200 are accessible by word lines WL0-WLy and bit lines BL0-BLx. The memory is organized into erase blocks, such as erase blocks 0, 1, ... m. Referring also to FIGS. 5A and 5B, if the NAND string 50 contains 16 memory cells, then the first bank of NAND strings in the array will be accessible by WL0 to WL15. The erase block 0 is organized to have all the memory cells of the first bank of NAND strings erased together. In another memory architecture, more than one bank of NAND strings may be erased together.

Figure 7:
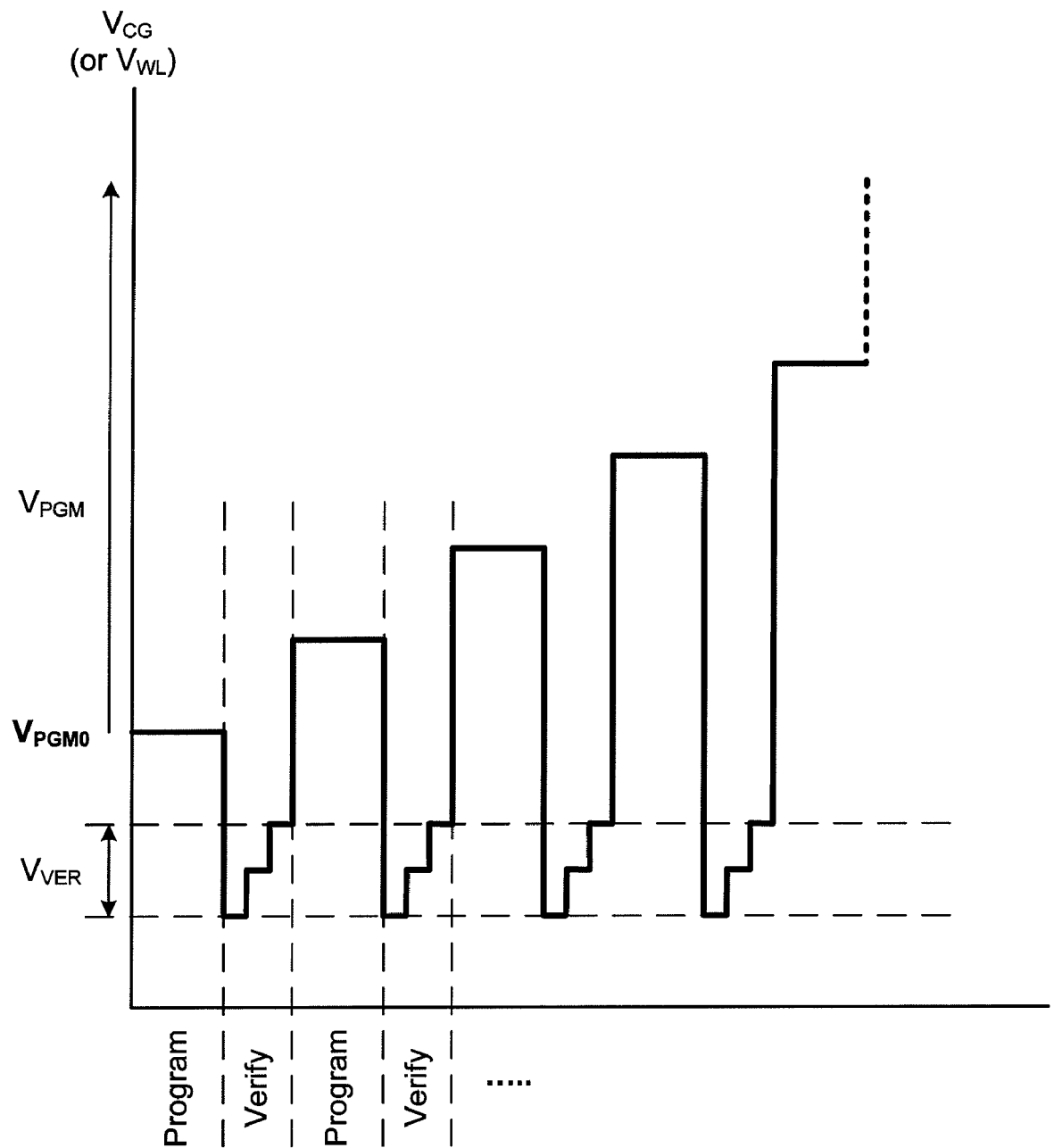
FIG. 7 illustrates a series of programming voltage pulses in the form of a staircase waveform being applied to a selected word line.

FIG. 7 illustrates a series of programming voltage pulses in the form of a staircase waveform being applied to a selected word line. When a cell is programmed to a given state, it is subject to successive programming voltage pulses, each time attempting to add incremental charge to the floating gate. In between pulses, the cell is read back or verified to determine its source-drain current relative to the breakpoint level. Programming stops when the current state has been verified to reach the desired state. The programming pulse train used may have increasing period or amplitude in order to counteract the accumulating electrons programmed into the charge storage unit of the memory cell. Programming circuits generally apply a series of programming pulses to a selected word line. In this way, a page of memory cells whose control gates are connected to the word line can be programmed together.

Memory Testing System

Figure 8:
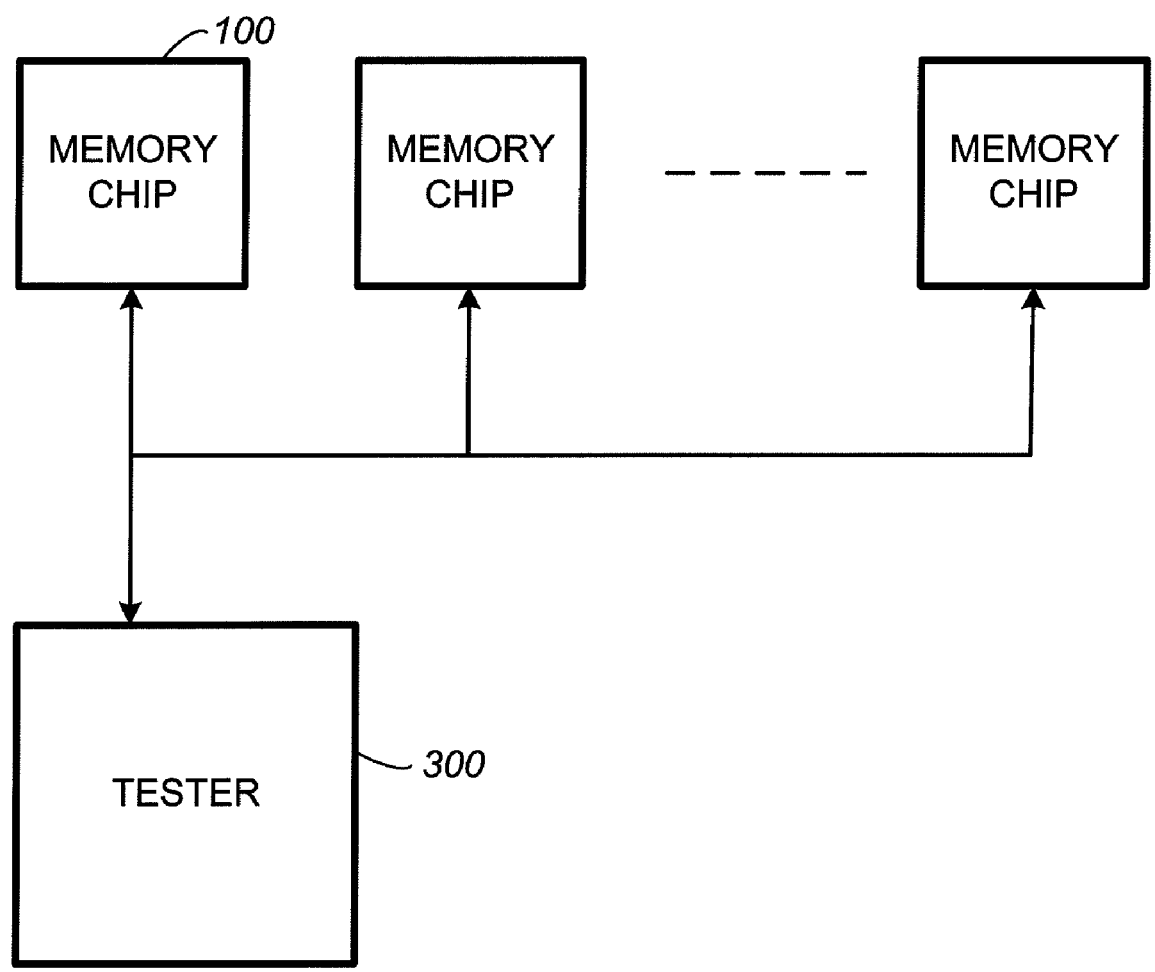
FIG. 8 illustrates a typical testing setup to determine optimum initial programming voltages for a number of memory chips.
Figure 9:
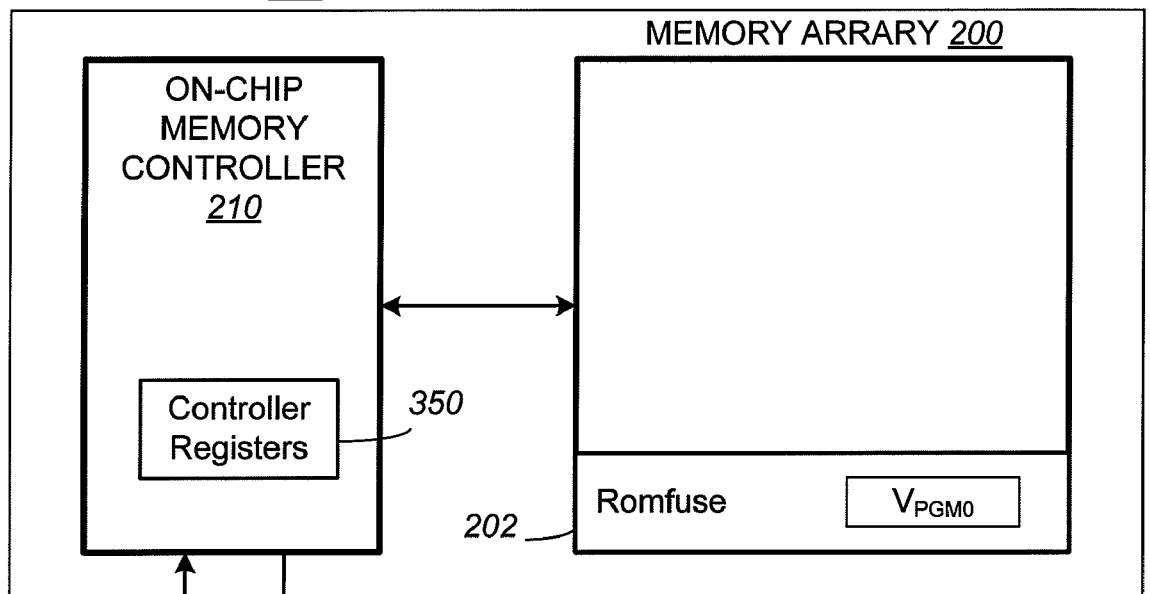
FIG. 9 illustrates schematically the function blocks of the memory tester testing one of the memory chips shown in FIG. 8 for determination of optimum initial programming voltages.
Figure 9:
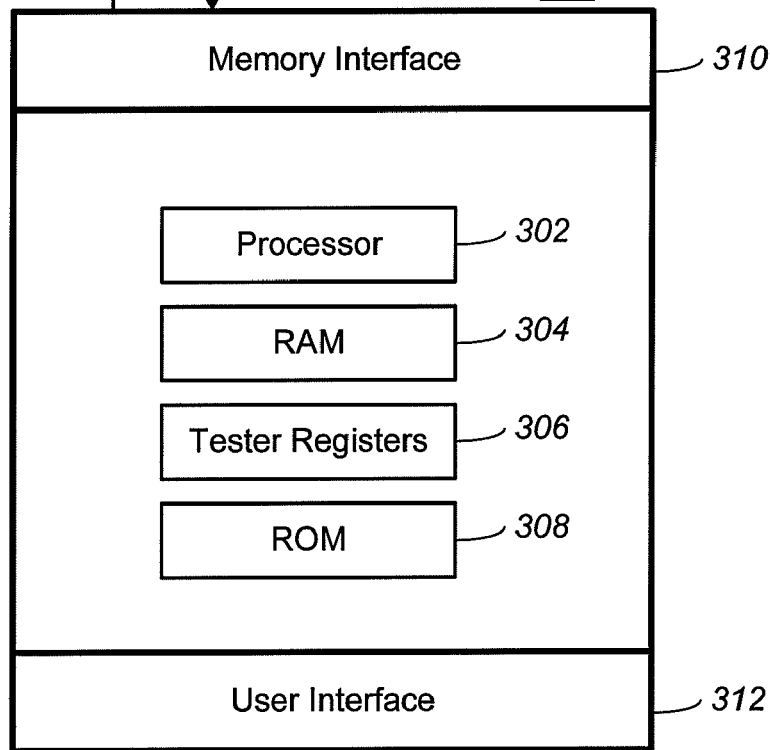
Figure 10:
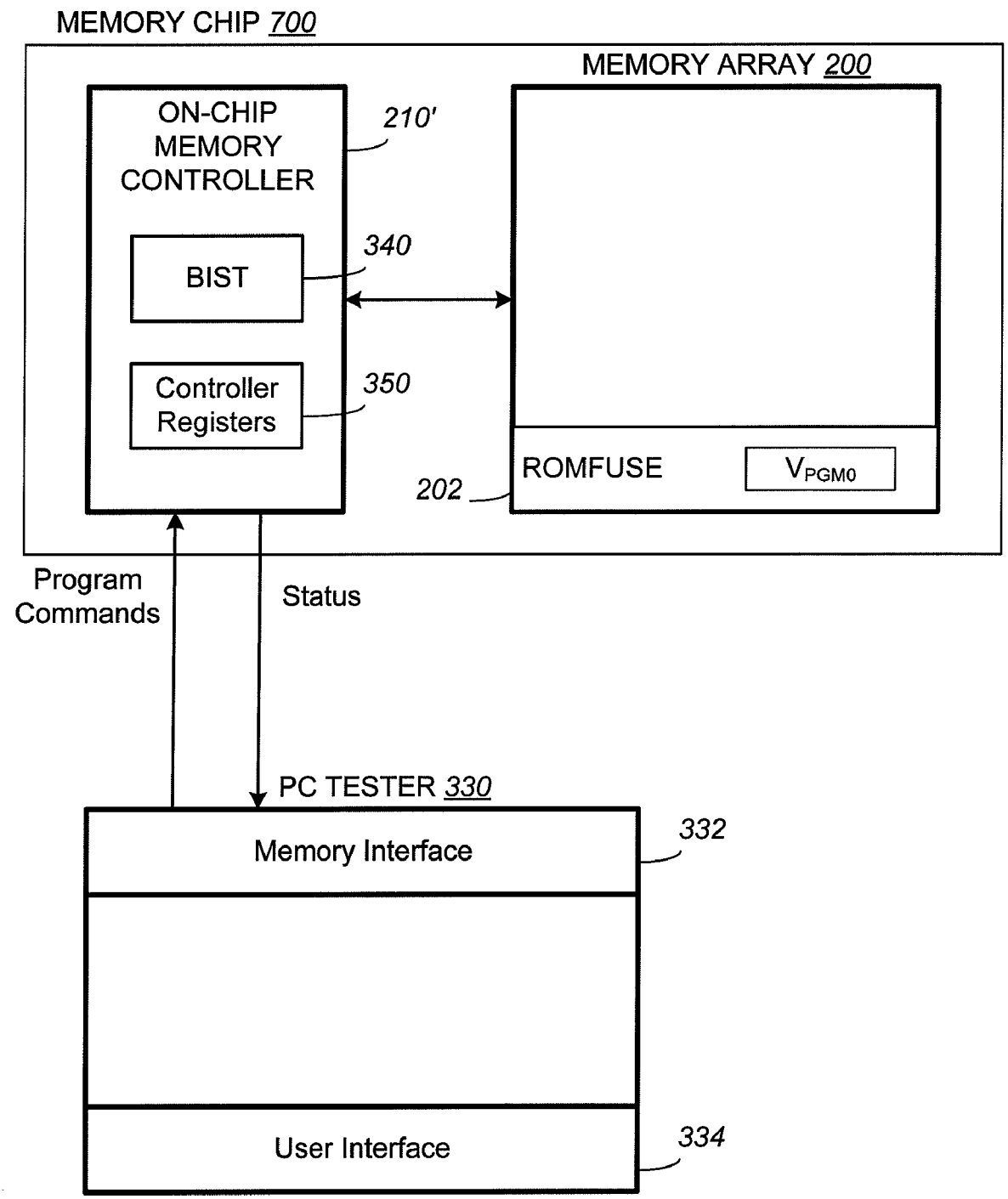
FIG. 10 illustrates the function blocks of an alternate memory tester operating with one of the memory chips shown in FIG. 8 for determination of optimum initial programming voltages, according to a preferred embodiment.

FIG. 8 to FIG. 10 illustrate example memory testing systems in which the various aspects of the present invention may be implemented.

To achieve good programming performance, the initial programming voltage $V_{PGM0}$ and the step size must be optimally chosen. If the initial programming voltage $V_{PGM0}$ is chosen too low, it may require an excessive number of programming pulses to reach the target state. On the other hand if $V_{PGM0}$ is chosen too high, especially in a multi-state memory, the programming may overshoot the target state in the first pulse. Similar considerations apply to the step size from one pulse to the next. Generally, an optimum step size will allow adequate resolution to transverse each partitioned or demarcated region shown in FIG. 3 in a few steps. An optimum initial programming voltage $V_{PGM0}$ would reach the target state in a few steps. Generally, the step size can be predetermined based on the number of partitions in the threshold window. The optimum $V_{PGM0}$ is fairly sensitive to manufacturing variations and is traditionally determined by testing at the factory. This is a process known as $V_{PGM0}$ trimming.

FIG. 8 illustrates a typical testing setup to determine optimum initial programming voltages for a number of memory chips. A memory tester 300 typically connects to a large number of memory chips 100 for parallel testing. Typically, before shipping from the factory, a dedicated memory tester is setup to test a number of memory chips in parallel. One of the tests is to determine optimum initial programming voltages ($V_{PGM0}$ trimmings.)

FIG. 9 illustrates schematically the functional blocks of the memory tester testing one of the memory chips shown in FIG. 8 for determination of optimum initial programming voltages. Essentially, the memory tester 300 issues a series of commands to the memory chip 100 for it to perform a number of program operations using different samples of initial programming voltage. The non-volatile memory array 200 has a reserved area ("ROMFUSE") 202 for storing system data. The memory tester interacts with the on-chip memory controller 210 via a memory interface 310. The tester has a processor 302 that executes a test program in RAM 304 that was initially retrieved from ROM 308. The test program execution is facilitated by a set of tester registers 306. The test program is controlled by a user through inputs from a user interface 312. Based on the test results, optimum initial programming voltages $V_{PGM0}$ are determined for various programming variations, such as different type of word lines and pages. These trimmed values are then stored back into the ROMFUSE 202. During normal use of the memory, the data in the ROMFUSE is loaded into the controller registers 350 on power-up so that the controller 210 has ready access to them during memory operations.

FIG. 10 illustrates the function blocks of an alternate memory tester operating with one of the memory chips shown in FIG. 8 for determination of optimum initial programming voltages, according to a preferred embodiment. In this implementation, much of the testing functionalities are built into the memory chip 100 itself. The on-chip memory controller 210' is further enhanced with an embedded Built-in Self Test ("BIST") module 340 and additional capacity for a set of controller registers 350. In this way, various tests including the $V_{PGM}$ trimming operations described may be performed on-chip. Based on the test results, an optimum initial programming voltage $V_{PGM0}$ can be determined either on-chip or by the external tester 330. This determined value is stored back into the ROMFUSE 202. During normal use of the memory, on power-up, the data in the ROMFUSE is loaded into the controller registers 350 on power-up so that the controller 210' has ready access to them during memory operations.

With the enhanced, self-testing on-chip controller 210', an external dedicated tester may no longer be required. A simple tester 310, implemented by a personal computer, will suffice for operating a large number of memory chips when they are being tested in parallel. The memory tester 310 interacts with the on-chip memory controller 210' via a tester memory interface 332. It receives operator inputs from a user interface 334. In one implementation, the tester 310 simply instructs each of the memory chips 100 to execute a self test and reports the status at the end of the test for each memory chip. In another implementation, the tester 310 gathers the statistics from the test results and makes statistical computations.

The self-testing on-chip controller 210' has the advantage of doing away with an expensive dedicated tester. Furthermore, it allows the possibility of testing in the field, so that as the memory device ages, its $V_{PGM0}$ values could be re-trimmed.

$V_{PGM}$ Trimming Operations

Figure 11A:
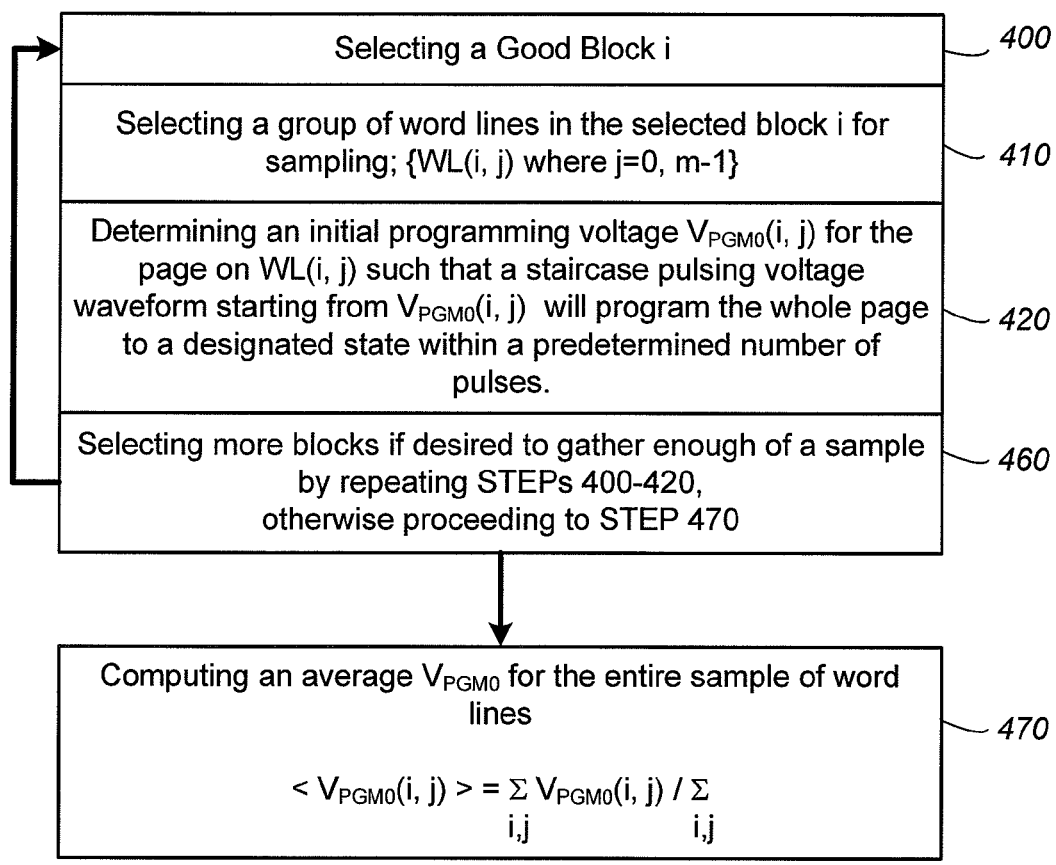
FIG. 11A is a flow diagram illustrating a general scheme for obtaining an estimated starting programming voltage for a given type of word lines in a memory device.

FIG. 11A is a flow diagram illustrating a general scheme for obtaining an estimated starting programming voltage for a given type of word lines in a memory device. As mentioned before, this process is also referred to as programming voltage ("$V_{PGM}$") trimming.

Figure 11B:
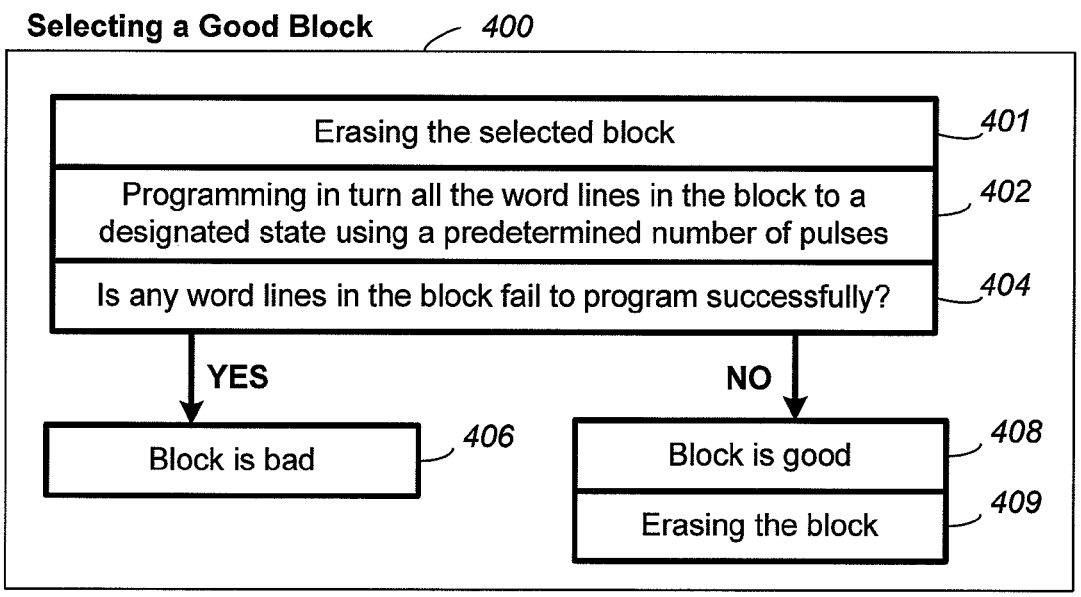
FIG. 11B illustrates in more detail one embodiment of selecting a good block shown in FIG. 11A.

STEP 400: Selecting a Good Block i. In some implementation, it is preferable to perform a quick programmability test on a block before subjecting it to a more time consuming $V_{PGM}$ trimming operation. Depending on implementation, this step is optional. It may be omitted by simply ignoring any defective word lines encountered. A more detailed description of determining a good block is shown in FIG. 11B.

STEP 410: Selecting a group of word lines in the selected block i for sampling; {WL(i, j) where j=0, m−1}. Generally, the group of word lines selected and the type of word lines it seeks to represent share similar programming characteristics.

STEP 420: Determining an initial programming voltage $V_{PGM0}(i, j)$ for the page on WL(i, j) such that a staircase pulsing voltage waveform starting from $V_{PGM0}(i, j)$ will program the whole page to a designated state within a predetermined number of pulses. A page of memory cells sharing the word line WL(i, j) is programmed in parallel. The staircase waveform increases by a step with every pulse and is budgeted to increase up to the predetermined number of pulses.

STEP 460: Selecting more blocks if desired to gather enough of a sample by repeating STEPs 400-420. For example, each block may contain three types of word lines having different programming characteristics. The first type comprises the first two word lines at the top boundary of the block. The second type comprises the last two word lines at the bottom boundary of the block. The third type comprises the bulk of the word lines in the core region of the block. To get a better sample for any one of these three types of word lines, a bigger sample is preferably taken, involving more blocks distributed across the memory array. As described in a later section, different samples of a similar type of word lines may also be formed by taking geometrically similarly located word lines from a set of blocks.

STEP 470: Computing an average starting programming voltage ("<$V_{PGM0}$>") for the entire sample of word lines. This is obtained by dividing the aggregate of $V_{PGM0}$ for each sampled word line by the aggregate of all sampled word lines, viz.:

$$<V_{PGM0}(i,\ j)> = \sum_{i,j} V_{PGM0}(i,\ j) / \sum_{i,j}$$

FIG. 11B illustrates in more detail one embodiment of selecting a good block shown in FIG. 11A. A good block is meant to be a block where all its pages of memory cells along the word lines are programmable. Thus, STEP 400 shown in FIG. 11A is further articulated as follows:

STEP 401: Erasing the block.

STEP 402: Programming in turn all the word lines in the block to a designated state using a predetermined number of pulses.

STEP 404: Is any word lines in the block fail to program successfully? If there is any failed ones, proceeding to STEP 406, otherwise proceeding to STEP 408.

STEP 406: The block is considered bad since it contains at least one defective word line. This is especially true of memory with NAND architecture, where a bad cell within a NAND chain usually renders the whole chain inoperable. The bad block will not be selected for $V_{PGM}$ trimming.

STEP 408: The block is good. The good block will be selected for $V_{PGM}$ trimming.

STEP 409: Erasing the block to that the word line in it are ready to be programmed.

In other implementations, where the existence of one or more defective word line does not necessary render the whole block defective, there is no need to perform a bad block search. In that case as described before, if a defective word line is encountered during test, it is simply ignored.

Figure 12:
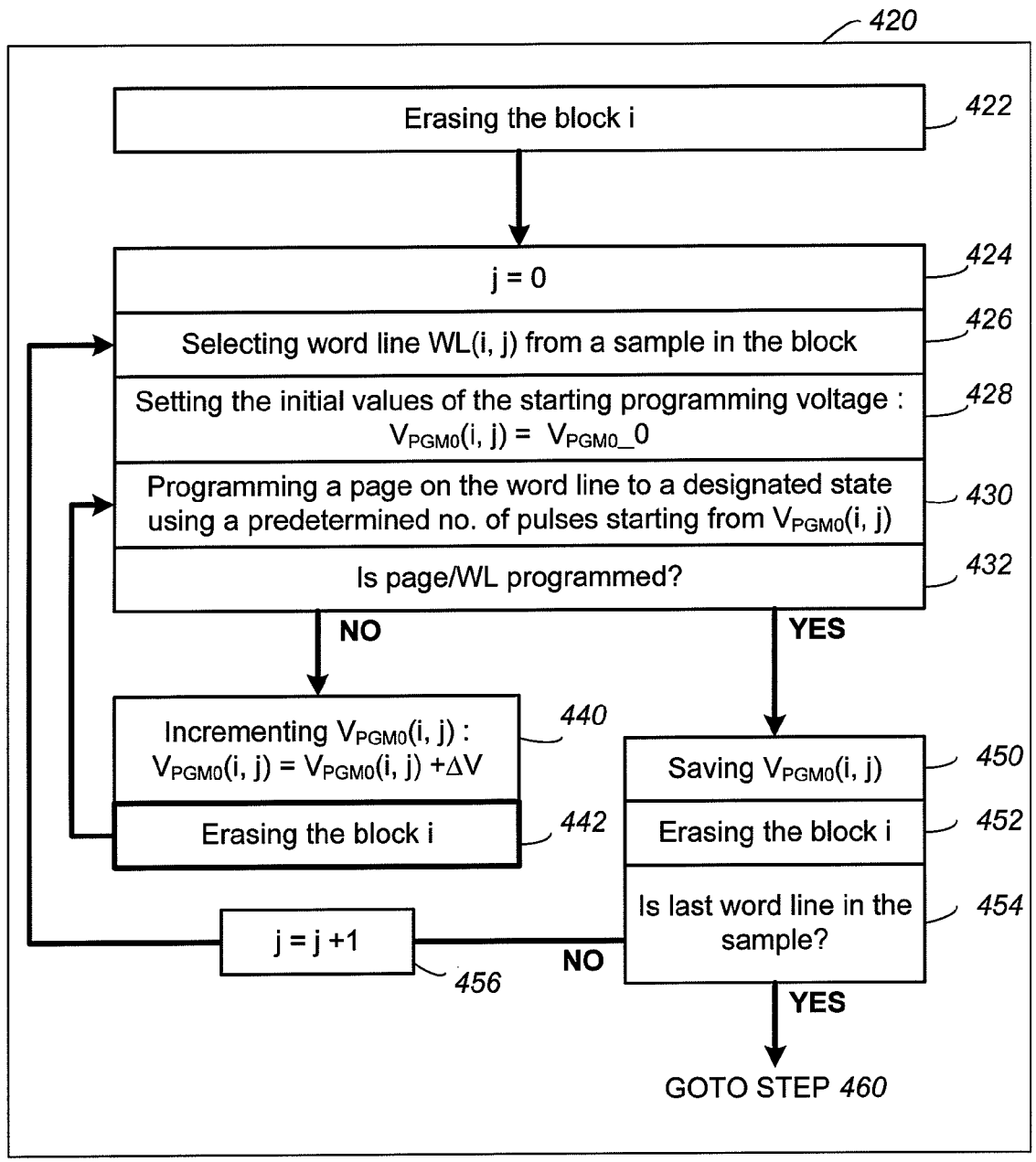
FIG. 12 is a flow diagram illustrating a conventional implementation of the steps of determining an initial programming voltage of a page on a word line.

FIG. 12 is a flow diagram illustrating a conventional implementation of the steps of determining an initial programming voltage of a page on a word line. In a conventional implementation of STEP 420 of FIG. 11A, the sampled word lines in a block are tested in a piece-meal manner for expediency and efficient use of storage. The next word line will be tested after the test on the previous one has completed. Thus, after the previous word line has been tested to program successfully (or determined to be unprogrammable) will the test be repeated on the next word line. In the convention case, STEP 420 shown in FIG. 11A will be further articulated as follows:

STEP 422: Erasing the block i so that the word lines in it can be programmed.

STEP 424: Initially, point to the first word line of the sample by setting j=0.

STEP 426: Using the "j" index to select the word line WL(i, j) from the sample in the block.

STEP 428: Setting the initial values of the starting programming voltages : $V_{PGM0}(i,j)=V_{PGM0\_0}$.

STEP 430: Programming a page on the word line to a designated state using a predetermined number of pulses starting from $V_{PGM0}(i, j)$.

STEP 432: Is page/WL programmed? If WL(i,j) is not programmed to the designated state, proceeding to STEP 440, otherwise proceeding to STEP 450.

STEP 440: incrementing $V_{PGM0}(i,\ j)$ such that $V_{PGM0}(i, j)=V_{PGM0}(i,j)+\Delta V$.

STEP 442: Erasing the block i to allow the word line to be reprogrammed with the incremented $V_{PGM0}(i, j)$.

STEP 450: The page has been programmed successfully. Collecting statistics by saving $V_{PGM0}(i,j)$.

STEP 452: Erasing the block i to allow the next word line to be programmed.

STEP 454: Is the last word line in the sample reached? If the last word line has not been tested, proceeding to STEP 456, otherwise proceeding to STEP 460 in FIG. 10A.

STEP 456: Moving to the next word line with j=j+1, and returning to STEP 424 to test the next word line.

It will be seen that in this conventional scheme, a page is repeated cycled through a succession of program loops with erases in between. As described earlier, testing the word lines in a piece-meal manner will subject the block to many more erasures, since for each word line every program loop around STEP 440 and STEP 442 will incur a block erasure. This expense is compounded on every word line under test.

Referring to FIG. 6 again, in a memory architecture where there are many word lines in each block, erasing a word line of cells multiple times would entail erasing the rest of the word lines in the same block the same number of times. As mentioned earlier, if these other word lines in the block are also being tested, the number of times the block is erased would go up geometrically. As much as half of a memory device's life usage could be used up before it gets to a customer.

$V_{PGM}$ Trimming With Reduced Erase Cycling

According to one aspect of the invention, in a non-volatile memory having an array of memory cells that are organized into blocks, each block being a block of word lines for accessing memory cells that are erasable together, and each word line containing at least one page of memory cells that are programmable together, an optimum starting voltage for programming a page of memory cells on a word line in a block is estimated by test programming a sample of similar word lines in the block to obtain a statistical average of individual starting voltages that enable each associated page/word line to be programmable to a designated pattern. This is accomplished by a subjecting all the pages of the sample to a program loop where a series of pulses from a starting programming voltage is applied. After each pages of the sample has been through the program loop, the page/word line that has been program-verified is removed from further processing and its associated starting programming voltage is saved. The block is then erased so that the not yet verified word lines in the sample can be reprogrammed subject to the next program loop the next incremented starting voltage. The cycling continues until all word lines in the sample have been program-verified. A statistical average can then be obtained from the individual starting programming voltages to derive an optimum starting programming voltage for the page.

Testing the sample of word lines in a block by the scheme described has the advantage of reducing the number of block erasures. The sample of word line are tested in phase with each other, so that when all the word lines are done programming in each program loop, they are then erased together to be ready for the next program loop. This scheme results in reducing the number of block erasure and can result in a saving of one order of magnitude compared to a conventional scheme.

For example, the convention scheme shown in FIG. 11 has each word line tested independently with block erasure before every program loop without synchronization with each other. The block erasure associated with every program loop for one word line is then compound for every word line in the sample.

Figure 13:
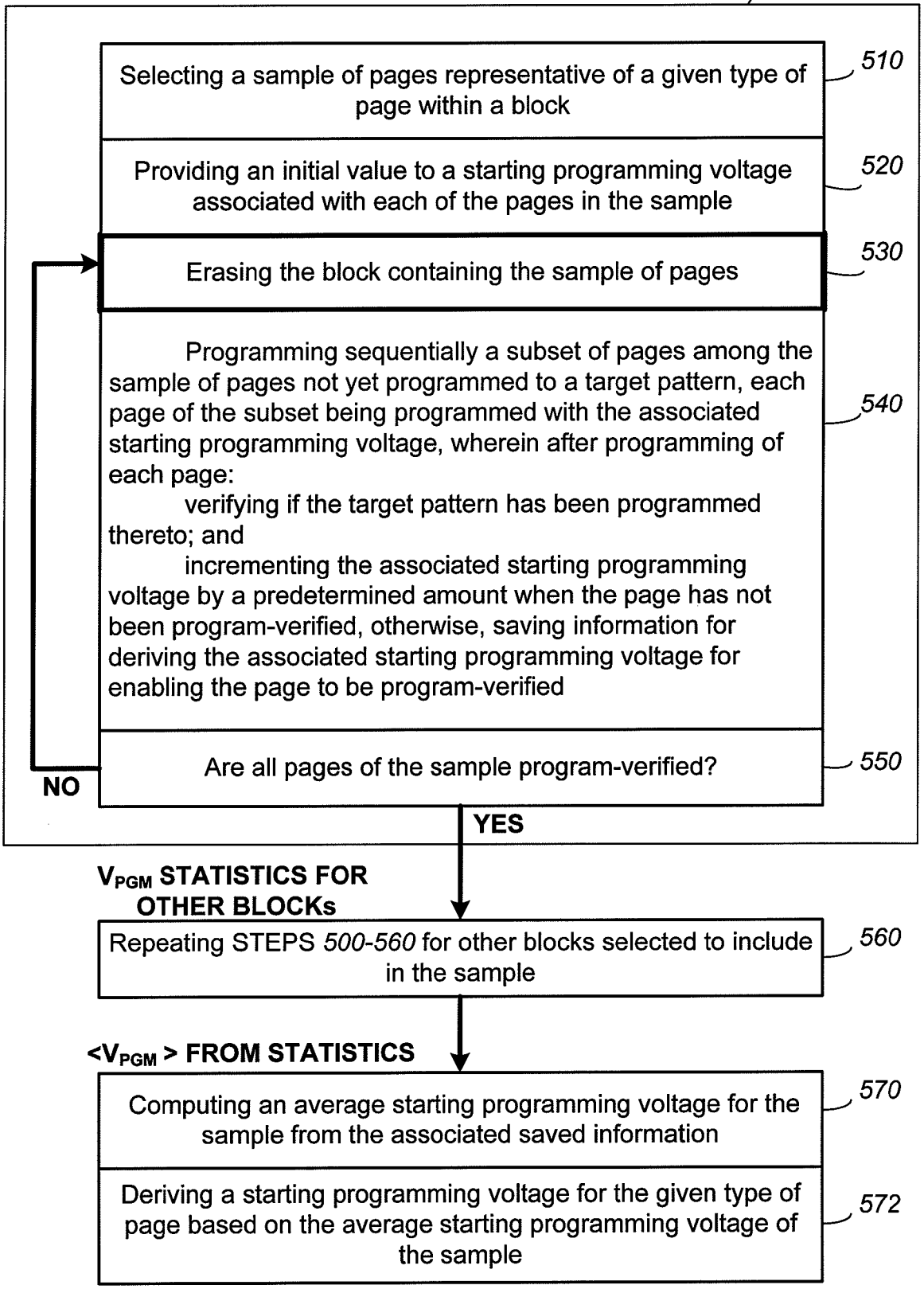
FIG. 13 is a flow diagram illustrating generally an operation for estimating an optimum starting programming voltage from a sample of word lines within a block, according to a preferred embodiment of the invention.

FIG. 13 is a flow diagram illustrating generally an operation for estimating an optimum starting programming voltage from a sample of word lines within a block, according to a preferred embodiment of the invention. The operation is illustrated to have three phases. The first phase 500 is for testing and collecting statistics of a sample of pages/word lines within a block. It includes STEP 510 to STEP 550. Each word line may support one or more physical page of memory cells. In addition, each page of memory cells may store one or more logical pages of data depending how many bits each memory cell can store. Thus, multiple logical pages may be associated with a given word line. Insofar as there are any significant variations in programming characteristics in programming the various logical pages, the programming of each logical page may have its own $V_{PGM}$ trimming on the same word line. At any one time the testing is directed to the programming of a given logical page on a given word line. For expediency, the terminology refers to testing a page or a word line interchangeably. The second phase, including STEP 560, is to repeat the first phase 500 on other blocks to be sampled. The first two phases can take place concurrently if the decoding and programming circuits support operating on more than one block. The third phase, including STEP 570 to STEP 572, is to compute a statistical average in order to derive an estimated optimum starting programming voltage for the type of word line under test.

The present operation essentially cycles through the word lines in the sample by applying a programming step to each word line with an associated starting voltage and then verifying to determine if the page on the word line is programmed to a designated state within a specified program loop target. If any page/word line is program-verified, the starting voltage associated with it is saved. If the page/word line is not yet program-verified, the starting voltage associated with it is incremented. The increment information is also saved, preferably into an accumulator. The cycling through the word lines is repeated on the ones that have not been program-verified so that after a block erasure, they are subject to another programming step with associated incremented starting voltages. This process continues until all the word lines in the sample have been program-verified within the specified program loop target.

STEP 510: Selecting a sample of pages representative of a given type of page within a block.

STEP 520: Providing an initial value to a starting programming voltage associated with each of the pages in the sample.

STEP 530: Erasing the block containing the sample of pages.

STEP 540: Programming sequentially a subset of pages among the sample of pages not yet programmed to a target pattern, each page of the subset being programmed with the associated starting programming voltage, wherein after programming of each page:

verifying if the target pattern has been programmed thereto; and incrementing the associated starting programming voltage by a predetermined amount when the page has not been program-verified, otherwise, saving information for deriving the associated starting programming voltage that enables the page to be program-verified.

STEP 550: Are all pages of the sample program-verified? If the pages are not all verified, returning to STEP 530, otherwise proceeding to STEP 560.

STEP 560: Repeating STEP 500 to STEP 560 for other blocks selected to include in the sample.

STEP 570: Computing an average starting programming voltage for the sample from the associated saved information.

STEP 572: Deriving a starting programming voltage for the given type of page based on the average starting programming voltage of the sample.

The specified program loop target is a limit for the maximum number of increments allowed. This limit has two different implications when implemented in two different manners.

In one embodiment, the limit sets a relatively low increment ceiling. It sets the maximum number of programming pulses or increments from the given starting voltage before programming of the page is deemed unsuccessful or insufficient. This number is set to be similar to the number of programming steps budgeted during an actual program operation in a normal use of the memory device. For example, in a normal program operation by the user, the programming for a particular logical page is required to be completed within eight to ten programming pulses. In this way, the $V_{PGM}$ trimming test closely duplicates real programming conditions. In general this limit ranges from five to fifteen.

In another embodiment to be described in more detail later, the programming voltage is allowed to increment until a final voltage results in a programmed page. The final voltage is then used to estimate an optimum starting voltage by scaling back a predetermined number of steps. In this embodiment, there is no limit set to emulate normal programming conditions. However, the increment of the starting programming voltage is not boundless in case a defective word line is encountered. Thus, the limit is set to a relative high (e.g., thirty to fifty) number to limit the increments to a maximum predetermined value in case a defective word line is encountered. When a page fails to be programmed to the designated state after the starting programming voltage has been incremented to the maximum value, the word line is deemed defective and its $V_{PGM}$ data will be excluded from the statistics. In another implementation, the whole block containing the defective word line may be excluded.

Thus, the two embodiments described impose a limit on the program loop for different reasons. The first with a lower limit measures programming success from a starting voltage by providing a margin of a number of pulsing steps as in a normal program operation. Programming is deemed successful if completed within the limit. Conversely, unsuccessful programming implies that the starting voltage is set too low. The second embodiment with the limit set to a high ceiling is to prevent boundless increments in case a defective word line can never by programmed. Thus, when this limit is reached, it does not mean the starting voltage is too low, but the word line is simply defective.

In yet another implementation, a lower limit is also contemplated. If the program loop is completed within the first few (e.g., one or two) steps of the staircase waveform, it will mean that the page has a very fast programming characteristics, which is not typical. Thus, in the case when a page is program-verified within a predetermined lower limit, it is deemed atypical and will also be excluded from the averaging so as not to skew the statistics.

Figure 14:
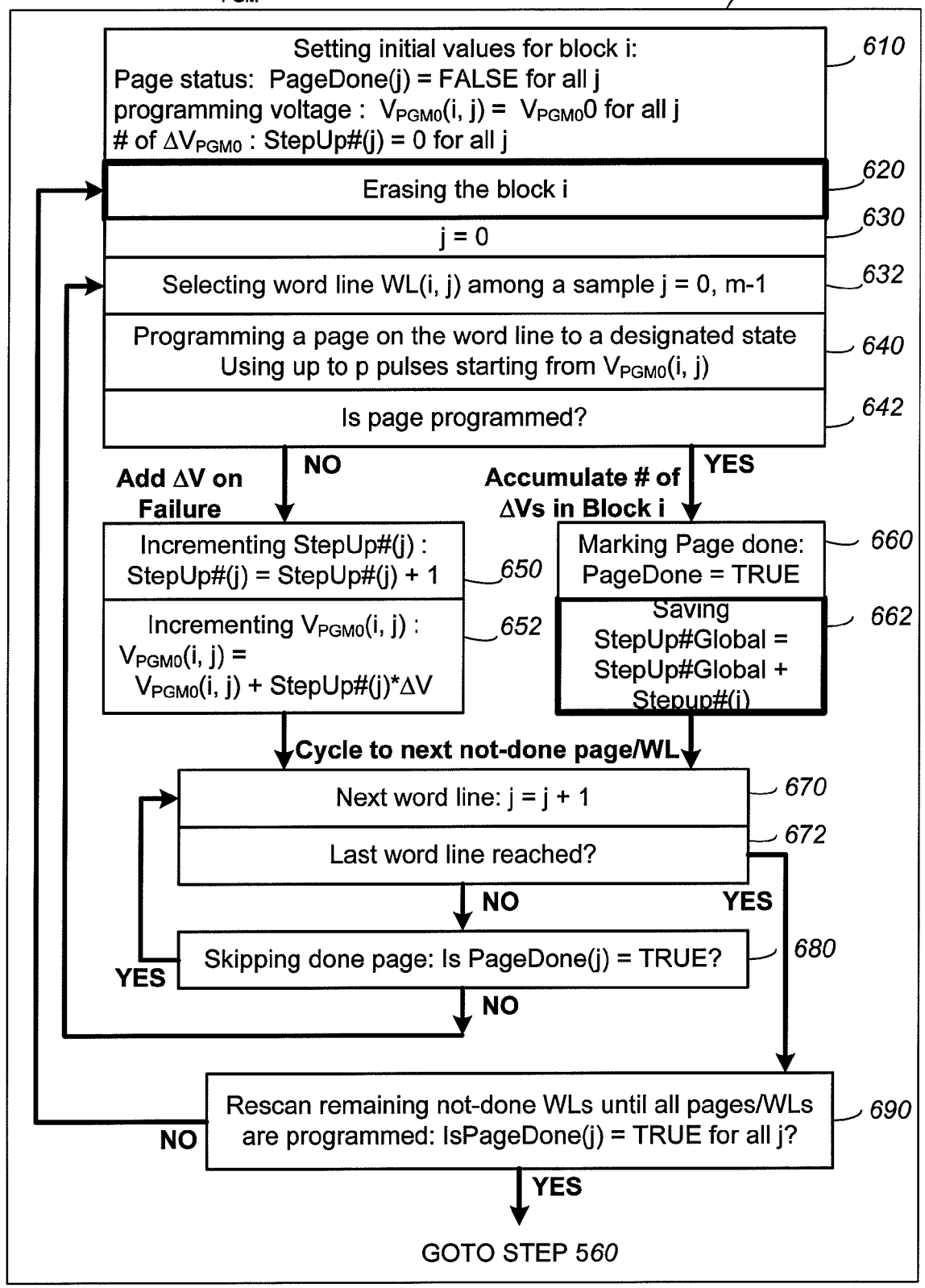
FIG. 14 is a flow diagram illustrating a specific implementation of the operation shown in FIG. 13.

FIG. 14 is a flow diagram illustrating a specific implementation of the operation shown in FIG. 13.

STEP 610: Setting initial values for block i:

Page verify status: PageDone(j)=FALSE for all j

Initial programming voltage: $V_{PGM0}(i,j)=V_{PGM0}\_0$ for all j

\# of DVPGM0: StepUp#(j)=0 for all j.

STEP 620: Erasing the block i.

STEP 630: j=0.

STEP 632: Selecting word line WL(i, j) among a sample: j=0, m−1

STEP 640: Programming a page on the word line to a designated state using up to a predetermined number of pulses starting from $V_{PGM0}(i,j)$.

STEP 642: Is page programmed? If the page is not program-verified, proceeding to STEP 650, otherwise proceeding to STEP 660.

STEP 650: The word line is not yet program-verified. So its associated initial programming voltage will be incremented by an additional step. Incrementing StepUp#(j): StepUp#(j)=StepUp#(j)+1.

STEP 652: Incrementing $V_{PGM0}(i,j)$: $V_{PGM0}(i,j)=V_{PGM0}(i,j)+\text{StepUp\#}(j)*\Delta V$ STEP 660: Testing of the word line is done and marking Page done: PageDone=TRUE.

STEP 662: The information for the final programming voltage is accumulated as the number of stepups from the initial voltage. StepUp#Global=StepUp#Global+Stepup#(j).

STEP 670: Next word line: j=j+1.

STEP 672: Last word line in the sample reached? (i.e. j=m?) If WL(i, j) is not the last word line, proceeding to STEP 680, otherwise proceeding to STEP 690.

STEP 680: Not processing done page: Is PageDone(j)=TRUE? If the status indicates the current page is already program-verified, it will be ignored or skipped with the process proceeding to STEP 670, otherwise the process returning to STEP 632 to testing the next word line that has not yet been program-verified.

STEP 690: Rescanning remaining not-done WLs until all pages/WLs are programmed: IsPageDone(j)=TRUE for all j? If at least one word line is not program-verified, returning to STEP 620 to reprogram it with the incremented programming voltage, otherwise programming of all word lines are done and the process will proceed to STEP 560 in FIG. 12.

Estimation of a Starting Voltage by Scaling

According to another aspect of the invention, the initial value of a starting programming voltage is estimated by an initial programming test run of the page on a word line. A selected page on a word line is successively programmed by a series of voltage pulses of a staircase waveform with verifications in between the pulses until the page is verified to have been programmed to a designated pattern. The final programming voltage at the time the page is program-verified will be used to estimate a starting programming voltage by scaling back a predetermined amount. An average starting programming voltage is obtained by considering a sample of similar page/word lines. Any unprogrammable page/word lines in the sample can be ignored so as not to skew the statistics with atypical entries.

In another embodiment, the process is further refined in which the estimated starting programming voltage from a first pass is used as the initial value of the staircase waveform in a second pass. In this way, when averaging over a sample of similar pages, the starting programming voltage for a representative page can be estimated. The starting programming voltage is estimated by offsetting the final programming voltage negatively by a predetermined number of steps of the staircase waveform. The predetermined number of steps is preferably similar to the number of steps budgeted for program success in a normal program operation.

One advantage of this scaling scheme is that a simple one-or two-pass programming test on each page/word line is sufficient to yield an estimate for the starting programming voltage for the page. Each page can be tested independently and does not involve multiple erase operation during the test. Therefore there is no need for management of block erase among a sample of word lines.

Figure 15:
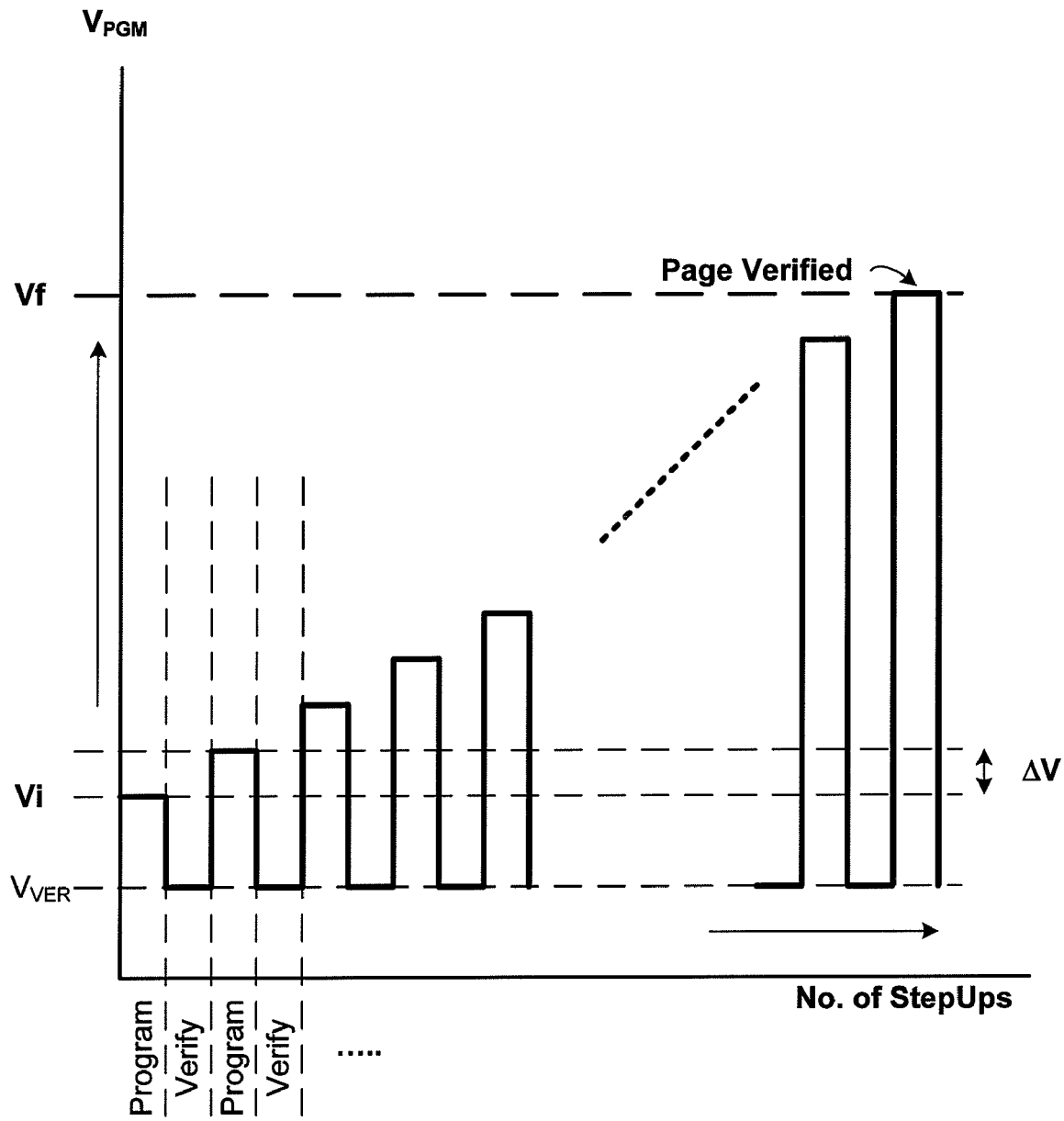
FIG. 15 illustrates the staircase waveform used in the initial programming test of a page of memory cells.

FIG. 15 illustrates the staircase waveform used in the initial programming test of a page of memory cells. The staircase waveform voltage is applied to the word line supporting the page of memory cells. Initially a voltage pulse at Vi is applied to perform an incremental programming. This is followed by the voltage changing to VVER suitable for reading the page to verify if the page has been programmed to a designated pattern. The process of program pulsing and verifying continues until the page is program-verified. At that point, the programming voltage has been incremented to Vf=StepUps#*ΔV. In one embodiment, this final voltage is backed off a predetermined number of steps to serve as an estimate for the starting programming voltage for the VPGM trimming tests described earlier, viz.: $V_{PGM0}=Vf-N_{offset}*\Delta V$, where NOFFSET is the predetermined number of steps.

Figure 16:
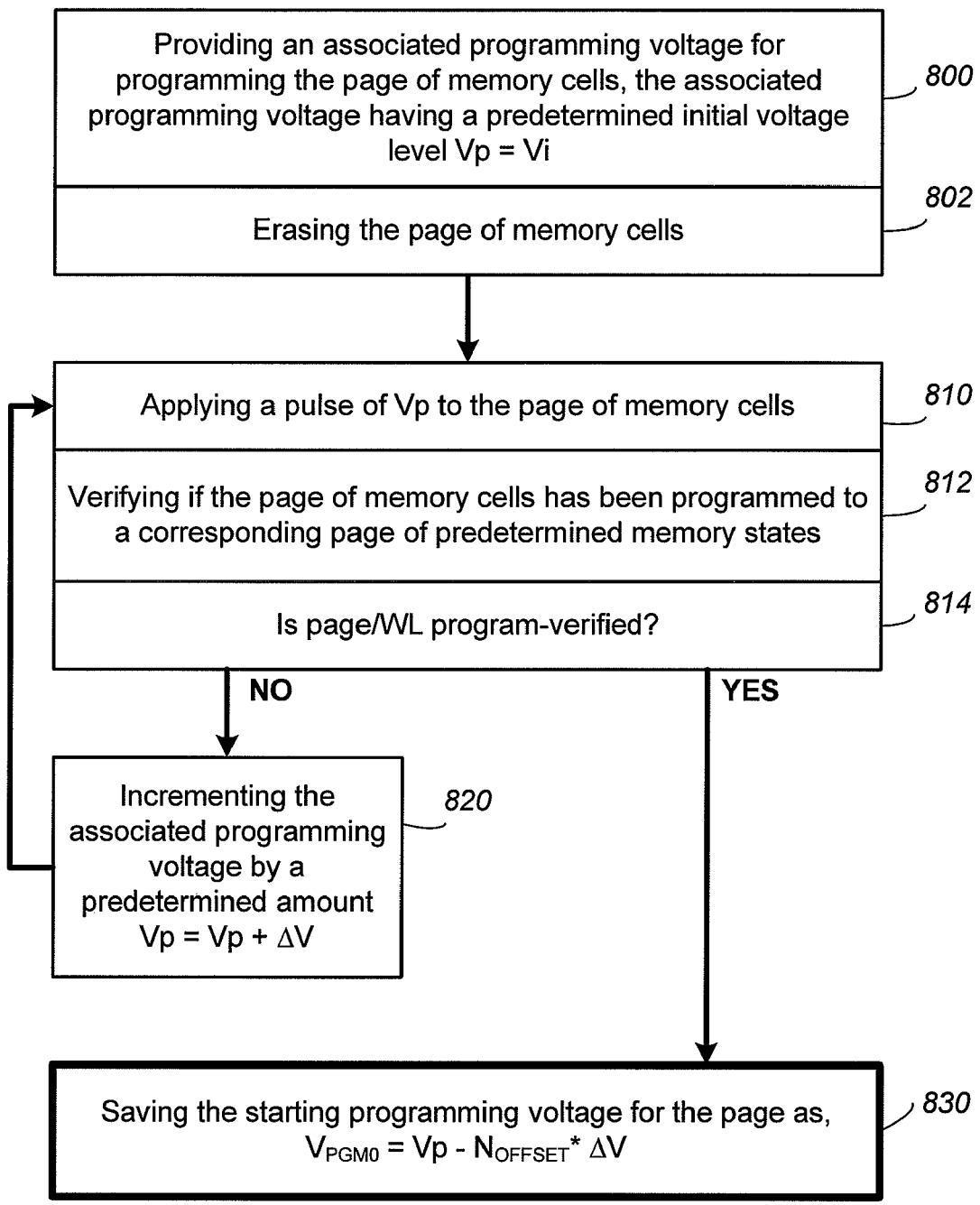
FIG. 16 is a flow diagram illustrating the determination of starting programming voltage for $V_{PGM}$ trimming, using the staircase waveform scan shown in FIG. 15.

FIG. 16 is a flow diagram illustrating the determination of starting programming voltage for a given page, using the staircase waveform scan shown in FIG. 15.

STEP 800: Providing an associated programming voltage for programming the page of memory cells, the associated programming voltage having a predetermined initial voltage level Vp=Vi.

STEP 802: Erasing the page of memory cells.

STEP 810: Applying a pulse of Vp to the page of memory cells.

STEP 812: Verifying if the page of memory cells has been programmed to a corresponding page of predetermined memory states.

STEP 814: Is page program-verified? If page is not program-verified, proceeding to STEP 820, otherwise proceeding to STEP 830.

STEP 820: Incrementing the associated programming voltage by a predetermined amount Vp=Vp+DV.

STEP 830: Saving the starting programming voltage for the page, $V_{PGM0}=Vp-N_{OFFSET}*\Delta V$. In a preferred implementation, the estimated starting programming voltage is further refined in a second pass test run where it is used as the initial value of the staircase waveform. In this way, the initial value more closely emulates normal programming operations as compared to the one used in the first pass test run.

As before, a sample of word lines of similar type are tested to obtain a statistically average starting programming voltage for the type. In order to reduce the storage for the test results, a statistical average is preferably performed after each test run.

Figure 17:
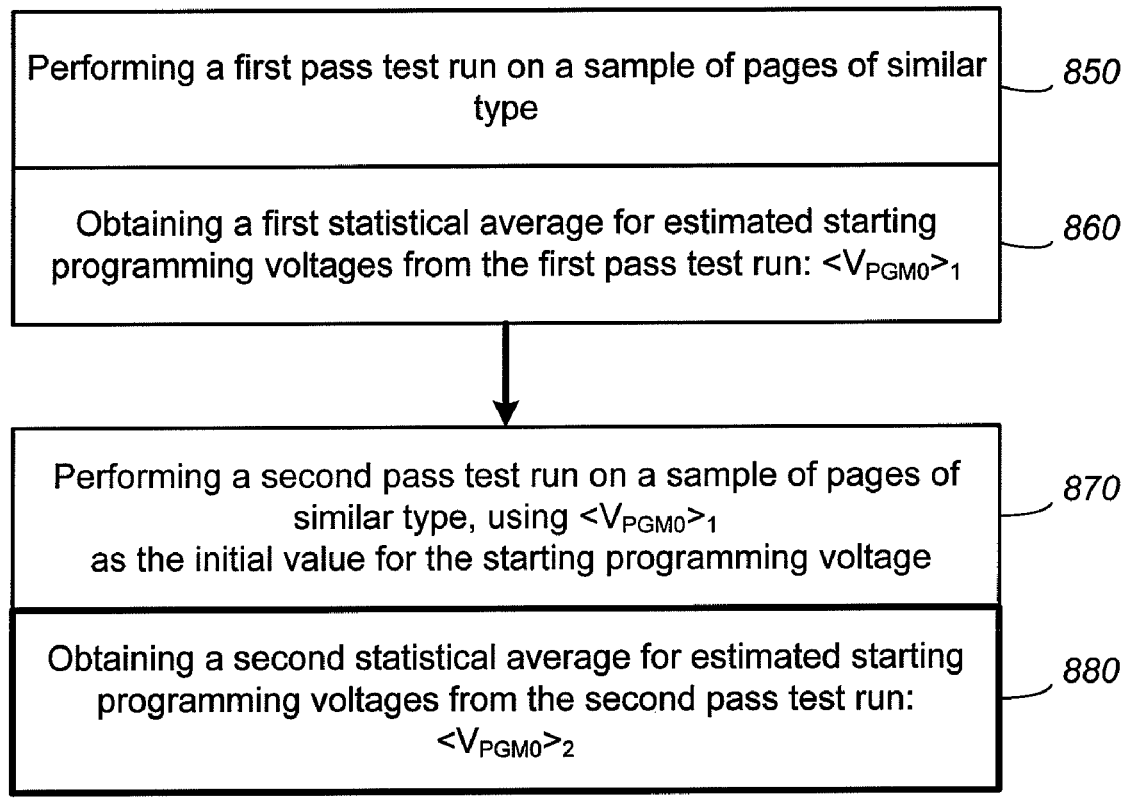
FIG. 17 is a flow diagram illustrating a multiple pass determination of starting programming voltage for a sample of pages/word lines.

FIG. 17 is a flow diagram illustrating a multiple pass determination of starting programming voltage for a sample of pages/word lines.

STEP 850: Performing a first pass test run (e.g., STEP 800 to STEP 830 for each page) on a sample of pages of similar type.

STEP 860: Obtaining a first statistical average for estimated starting programming voltages from the first pass test run: $<V_{PGM0}>_1$.

STEP 870: Performing a second pass test run (e.g., STEP 800 to STEP 830 for each page) on a sample of pages of similar type, using $<V_{PGM0}>_1$ as the initial value for the starting programming voltage (i.e., $Vi=<V_{PGM0}>_1$).

STEP 880: Obtaining a second statistical average for estimated starting programming voltages from the second pass test run: $<V_{PGM0}>_2$.

In one embodiment, only one pass (STEP 850 to STEP 860) is sufficient to obtain an acceptable estimation of the starting programming voltage. In another embodiment, a second pass (STEP 870 to STEP 880) is optionally used to refine the result obtained from the first pass.

In another implement, the estimated starting voltage $<V_{PGM0}>_1$ or $<V_{PGM0}>_2$ may be used as input for the initial value for the VPGM trimming scheme described in FIG. 13 and FIG. 14. The tests described in STEP 520 of FIG. 13 and STEP 610 of FIG. 14 require an initial value $V_{PGM0\_0}$ for the starting programming voltage. If this value is set too low, the test will have to cycle through more steps before the word line is program-verified. This will be inefficient and consuming more erase cycles of the memory device. On the other hand if the value is set too high, the word line may be over-programmed.

$V_{PGM}$ Trimming Weighted Toward Faster Programming Pages

According to another aspect of the invention, in a memory array having multiple erasable blocks, each block having a group of word lines with similar type of programming characteristics, a scheme for obtaining an optimum starting programming voltage of a representative page of the group includes: forming samples over a set of blocks with one or more word line from a geometrically similar location of each block of the set, obtaining a statistic estimation of a programming voltage from each sample of the set, and selecting a minimum estimation among the set to derive the optimum starting programming voltage. In this way, the optimum value is weighted towards the faster programming word lines for that group since they require a lower programming voltage compared to the slower ones.

The programming voltage trimming schemes described in other sections examine a page at a time as to whether all bits in the page are program-verified or not. This implies the test results are catering to the slower programming bits, as these slower bits must also be program-verified before the whole page is deemed program-verified. The consequence is that the starting voltage may be over estimated for the faster programming bits with the danger of over-programming. The present sampling and statistical computational scheme allows a lowest value to be selected for the set of starting voltages that was derived from a scheme biased towards the slower programming bits.

By geometrically similar location, it is understood that there are certain symmetries in the layout of the physical memory array. Structures belonging to the same symmetry group would have very similar characteristics. Referring to FIG. 6 for example, WL2 to WL13 form a group of word lines in the core region of an erase block with somewhat similar but not identical type of programming characteristics. A set of blocks is for example, from block0 to block127. The samples are formed by selecting a word line from a geometrically similar location of each block of the set. Thus, a first sample would be constituted from WL2 from block0, WL18 from block1, WL34 from block2, . . . , WL1034 from block127. A second sample would be constituted from WL3 from block0, WL19 from block1, WL35 from block2, . . . , WL1035 from block127. All in all there will be a set of 128 samples. $V_{PGM}$ trimming operations can be performed on each of the samples and therefore 128 statistical results (e.g. $<V_{PGM0}>$ will be obtained. The present method calls for selecting a smallest one among the 128 $<V_{PGM0}>$s.

Figure 18:
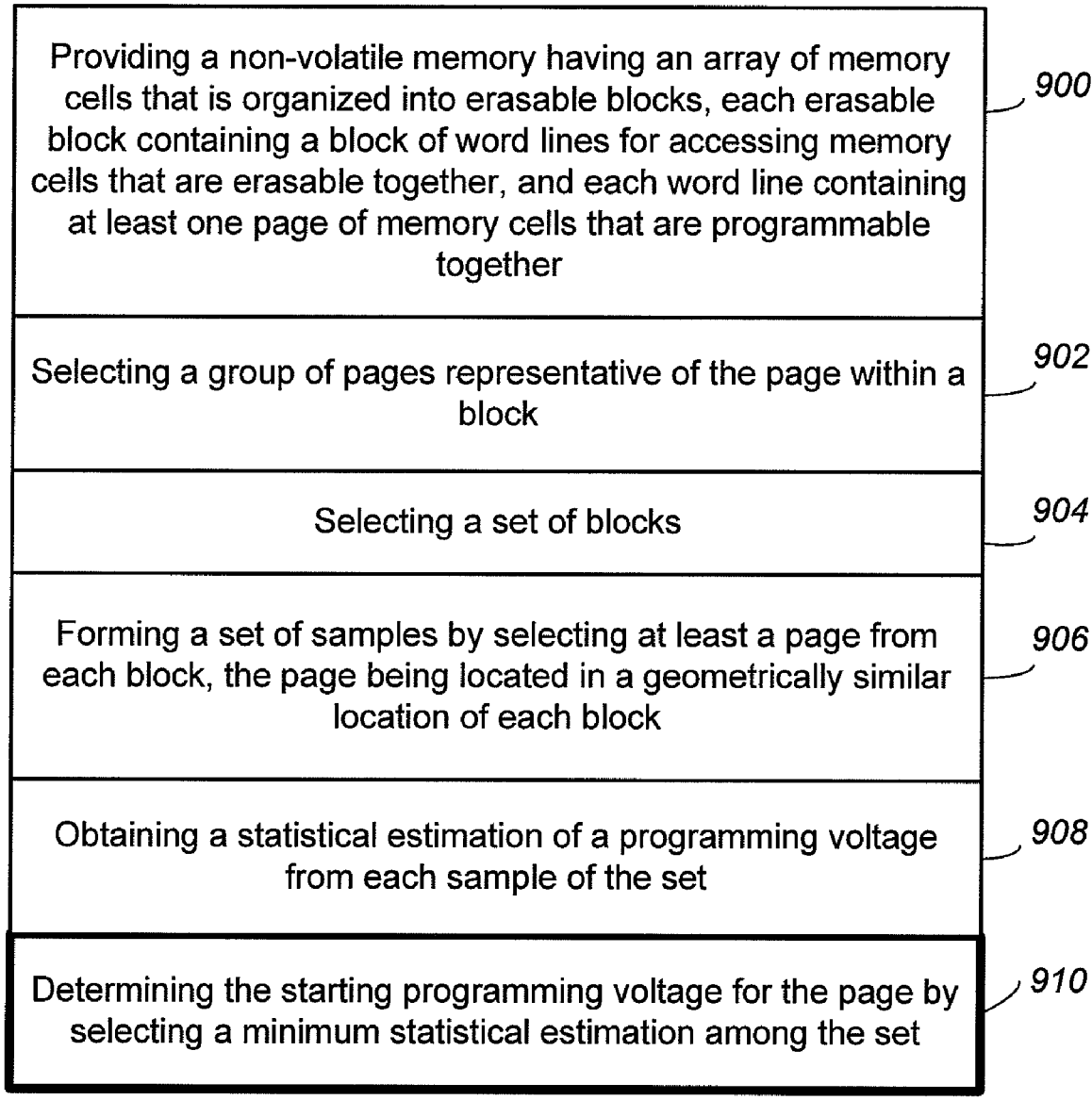
FIG. 18 is a flow diagram illustrating the scheme of obtaining a $V_{PGM}$ trimmed value that is weighted toward the faster programming word lines.

FIG. 18 is a flow diagram illustrating the scheme of obtaining a $V_{PGM}$ trimmed value that is weighted toward the faster programming word lines.

STEP 900: Providing a non-volatile memory having an array of memory cells that is organized into erasable blocks, each erasable block containing a block of word lines for accessing memory cells that are erasable together, and each word line containing at least one page of memory cells that are programmable together.

STEP 902: Selecting a group of pages representative of the page within a block.

STEP 904: Selecting a set of blocks.

STEP 906: Forming a set of samples by selecting at least a page from each block, the page being located in a geometrically similar location of each block.

STEP 908: Obtaining a statistical estimation of a programming voltage from each sample of the set.

STEP 910: Determining the starting programming voltage for the page by selecting a minimum statistical estimation among the set. The scheme of testing individual samples formed by selecting at least a similar page from each block also has the advantage of minimum storage requirement. After each sample is tested, a test result in the form of an average is obtained and stored. Then the next sample is tested in similar manner and its average is then compared to the first one in storage. Whichever average is the lower one will be retained in storage so that only one data need be stored as the set of samples is processed a sample at a time.

Also, with the sample formed by selecting a relatively small portion from each of the blocks, another advantage is that the sample average is not as sensitive to the presence of any bad blocks where a large portion of the word lines in it may be defective.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

What is claimed is:

1. In a non-volatile memory having an array of memory cells that is organized into erasable blocks, each erasable block containing a block of word lines for accessing memory cells that are erasable together, and each word line containing at least one page of memory cells that are programmable together, a method of determining a starting programming voltage for a given page, comprising:

(a) selecting a sample of pages representative of the given page within a block;

(b) providing an associated programming voltage for programming each page of the sample, the associated programming voltage having a staircase waveform with an associated initial value and a predetermined number of steps;

(c) erasing the block containing the sample of pages;

(d) determining for every page in the sample if the page is programmable to a target pattern using the associated programming voltage with the associated initial value;

and if programmable, excluding the page from further processing after accumulating the associated initial value as part of a gathered statistics, otherwise, incrementing the associated initial value by a predetermined step;

(e) repeating (c) to (d) until all pages in the sample has either been determined to be programmable or the associated initial value has been incremented to a predetermined maximum voltage;

(f) computing an average starting programming voltage for the sample from the gathered statistics to derive a starting programming voltage for the page.

2. The method as in claim 1, wherein:
the sample is part of larger sample taken from a plurality of blocks in the memory array; and
the gathered statistics includes accumulated initial values associated with programmable pages from the plurality of blocks.

3. The method as in claim 1, wherein
the predetermined step increment of the associated initial value is commensurate with a step of a similar programming voltage applied to the memory during a normal program operation.

4. The method as in claim 2, wherein
the predetermined step increment of the associated initial value is commensurate with a step of a similar programming voltage applied to the memory during a normal program operation.

5. The method as in claim 1, wherein the predetermined number of steps of the staircase waveform of the associated programming voltage is fifteen or less.

6. The method as in claim 2, wherein the predetermined number of steps of the staircase waveform of the associated programming voltage is fifteen or less.

7. The method as in claim 1, wherein the predetermined maximum voltage is the initial value plus an integral number of steps of the staircase waveform voltages.

8. The method as in claim 2, wherein the predetermined maximum voltage is the initial value plus an integral number of steps of the staircase waveform voltages.

9. The method as in claim 7, wherein the integral number of steps is more than forty.

10. The method as in claim 8, wherein the integral number of steps is more than forty.

11. The method as in claim 1, wherein accumulating the associated initial value as part of a gathered statistics includes:
accumulating the number of steps the initial value has incremented to when the page is program-verified; and
said computing an average starting programming voltage for the sample is by a product of an average of the number of incremented steps for the sample and the predetermined step of voltage.

12. The method as in claim 2, wherein accumulating the associated initial value as part of a gathered statistics includes:
accumulating the number of steps the initial value has incremented to when the page is program-verified; and
said computing an average starting programming voltage for the sample is by a product of an average of the number of incremented steps for the sample and the predetermined step of voltage.

13. The method as in claim 1, further including:
(g) performing an initial programming on the page with a staircase waveform programming voltage having a starting voltage;
(h) verifying if a target pattern has been programmed to the page in between each of the steps of the staircase waveform;
(i) obtaining a final voltage of the staircase waveform when the page is program-verified; and
(j) estimating the associated starting programming voltage by linear scaling of the final voltages; and
wherein (g)-(j) are performed prior to (a)-(f).

14. The method as in claim 2, further including:
(g) performing an initial programming on the page with a staircase waveform programming voltage having a starting voltage;
(h) verifying if a target pattern has been programmed to the page in between each of the steps of the staircase waveform;
(i) obtaining a final voltage of the staircase waveform when the page is program-verified; and
(j) estimating the associated starting programming voltage by linear scaling of the final voltages; and
wherein (g)-(j) are performed prior to (a)-(f).

15. The method as in claim 2, further comprising:
forming a set of samples by selecting a page from each block, the page being located in a geometrically similar location of each block;
obtaining a statistical estimation of a programming voltage from each sample of the set; and
wherein the step of computing an average starting programming voltage for the sample is by selecting a minimum statistical estimation among the set.

16. The method as in any one of claims 1-15, wherein individual memory cells each stores one bit of data.

17. The method as in any one of claims 1-15, wherein individual memory cells each stores more than one bit of data.

* * * * *